(12) United States Patent
Lee et al.

(10) Patent No.: US 12,201,022 B2
(45) Date of Patent: Jan. 14, 2025

(54) THERMOELECTRIC MODULE AND POWER GENERATION DEVICE INCLUDING SAME

(71) Applicant: LG INNOTEK CO., LTD., Seoul (KR)

(72) Inventors: Un Hak Lee, Seoul (KR); Sang Hoon Bong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/027,066

(22) PCT Filed: Sep. 13, 2021

(86) PCT No.: PCT/KR2021/012398
§ 371 (c)(1),
(2) Date: Mar. 17, 2023

(87) PCT Pub. No.: WO2022/060026
PCT Pub. Date: Mar. 24, 2022

(65) Prior Publication Data
US 2023/0329112 A1 Oct. 12, 2023

(30) Foreign Application Priority Data
Sep. 17, 2020 (KR) .......................... 10-2020-0119804

(51) Int. Cl.
*H10N 10/13* (2023.01)
*H10N 10/17* (2023.01)
(52) U.S. Cl.
CPC ............. *H10N 10/13* (2023.02); *H10N 10/17* (2023.02)

(58) Field of Classification Search
CPC ............................. H10N 10/13; H10N 10/17
See application file for complete search history.

(56) References Cited

U.S. PATENT DOCUMENTS

| 2011/0265838 A1* | 11/2011 | Kambe | ................. | H10N 10/13 |
| | | | | 136/223 |
| 2014/0311543 A1* | 10/2014 | Jinushi | .................. | H10N 10/13 |
| | | | | 136/205 |

(Continued)

FOREIGN PATENT DOCUMENTS

| JP | 2006-066431 A | 3/2006 |
| KR | 10-2015-0040590 A | 4/2015 |

(Continued)

*Primary Examiner* — Tae-Sik Kang
(74) *Attorney, Agent, or Firm* — Birch, Stewart, Kolasch & Birch, LLP

(57) ABSTRACT

Disclosed is a thermoelectric device, according to one embodiment of the present invention, comprising: a fluid movement part including a groove part extending in a first direction on one surface; a thermoelectric module arranged on the one surface; and a shield member arranged on the thermoelectric module, wherein the shield member includes: a first part overlapping with the thermoelectric module in the vertical direction; a second part deviated from the thermoelectric module in the vertical direction; and a stepped part for connecting the first part to the second part, and the second part is closer than the first part to one surface of the fluid movement part, and the groove part of the fluid movement part overlaps with the second part and/or the stepped part in the vertical direction.

14 Claims, 22 Drawing Sheets

(56) References Cited

U.S. PATENT DOCUMENTS

| | | | |
|---|---|---|---|
| 2021/0074901 A1 | 3/2021 | Jeon et al. | |
| 2021/0226112 A1 | 7/2021 | Lee et al. | |
| 2021/0234082 A1 | 7/2021 | Lee et al. | |

FOREIGN PATENT DOCUMENTS

| | | |
|---|---|---|
| KR | 10-2020-0007265 A | 1/2020 |
| KR | 10-2020-0015126 A | 2/2020 |
| KR | 10-2020-0034982 A | 4/2020 |
| WO | 2010/084718 A1 | 7/2010 |

* cited by examiner

[FIG. 1]
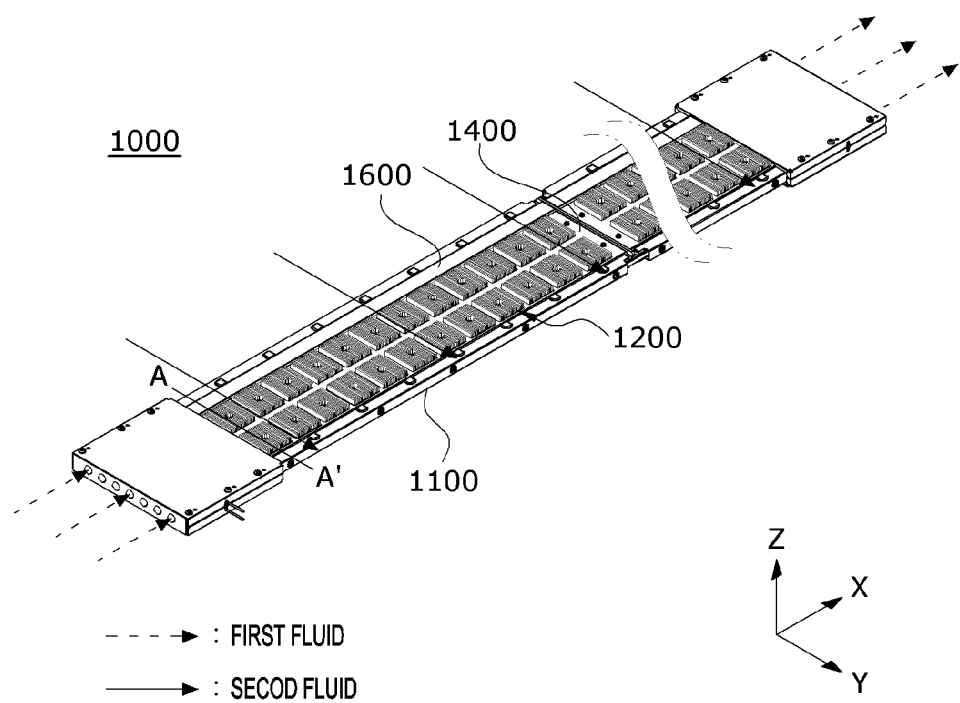

[FIG. 2]
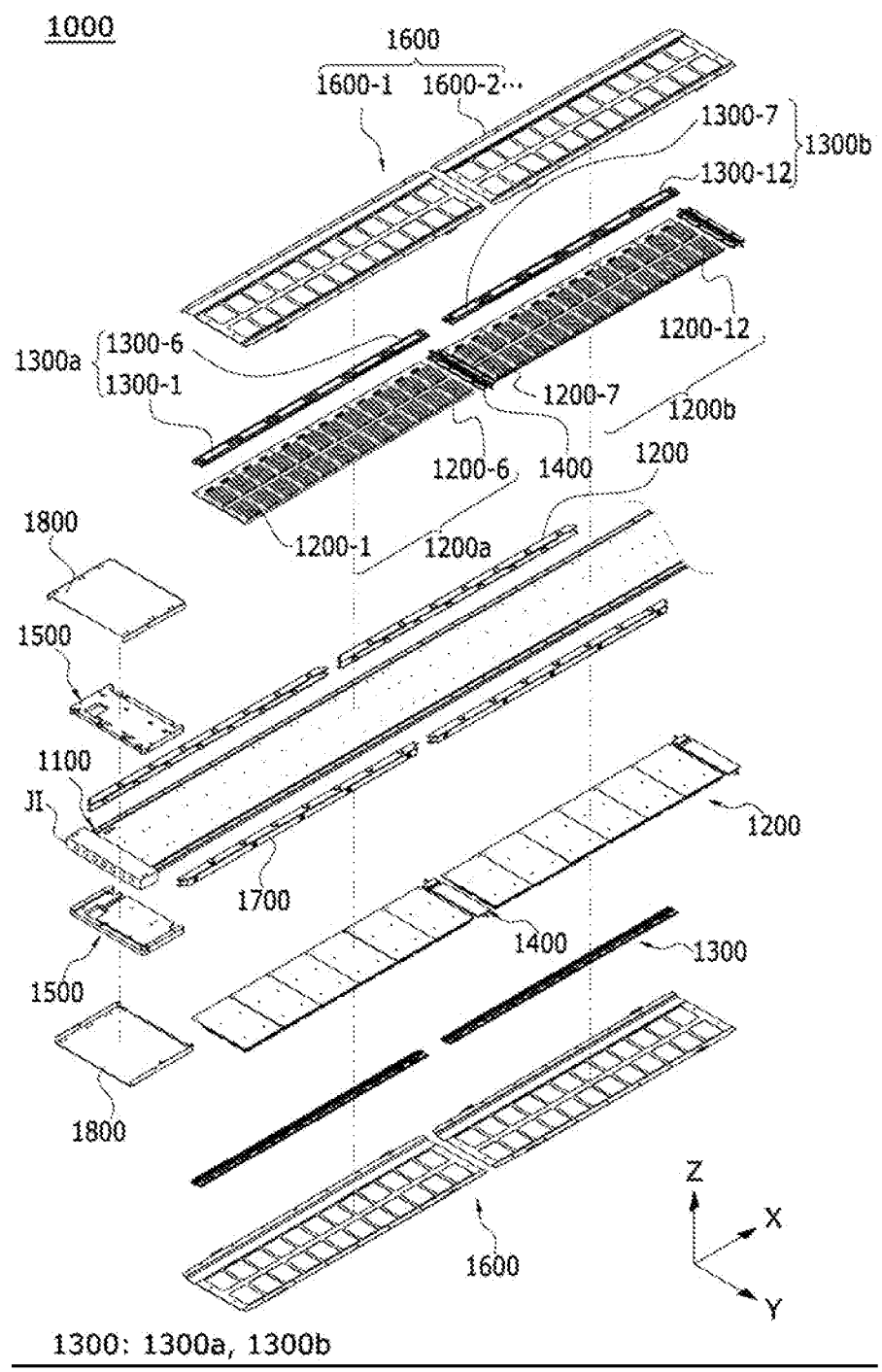

[FIG. 3]
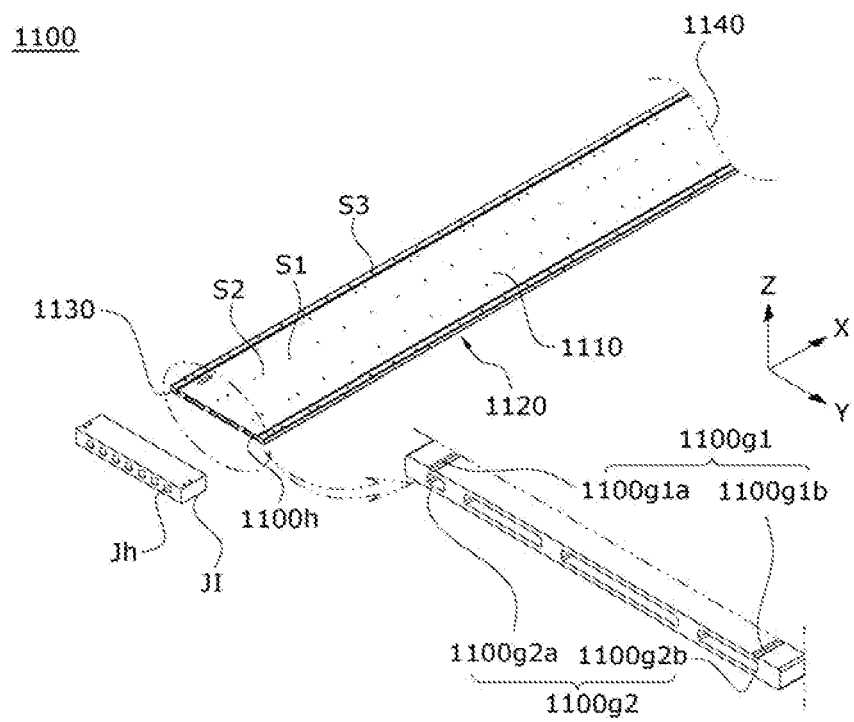
[FIG. 4]
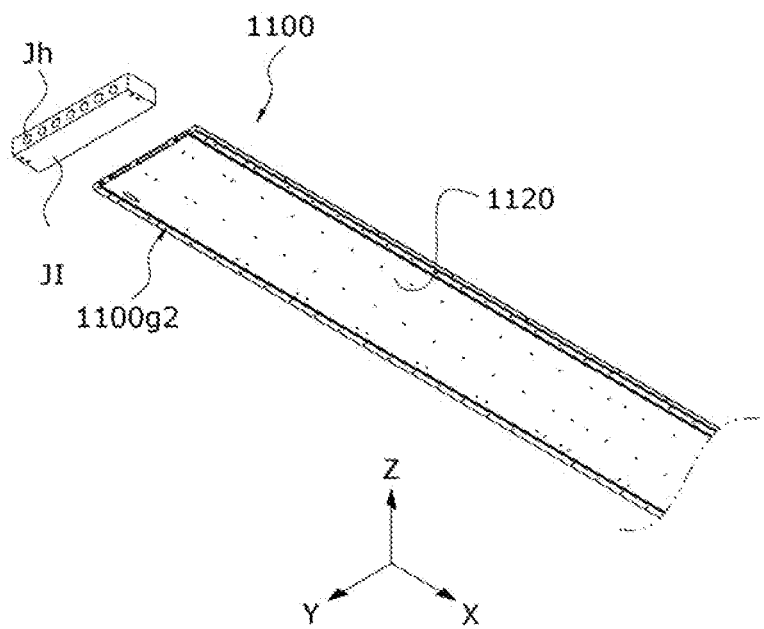

[FIG. 5]
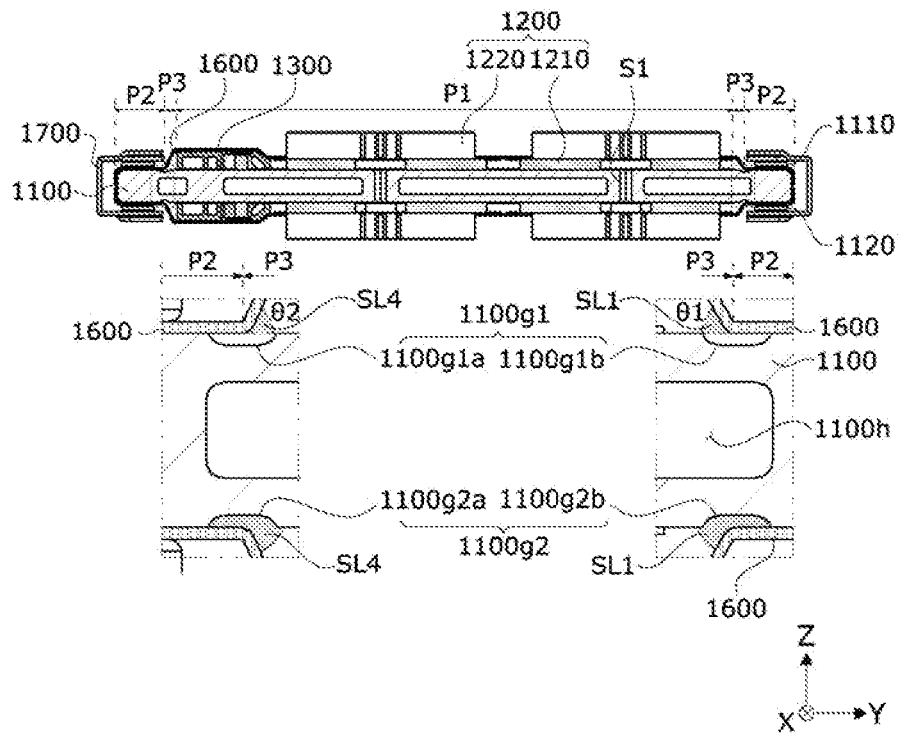
[FIG. 6]
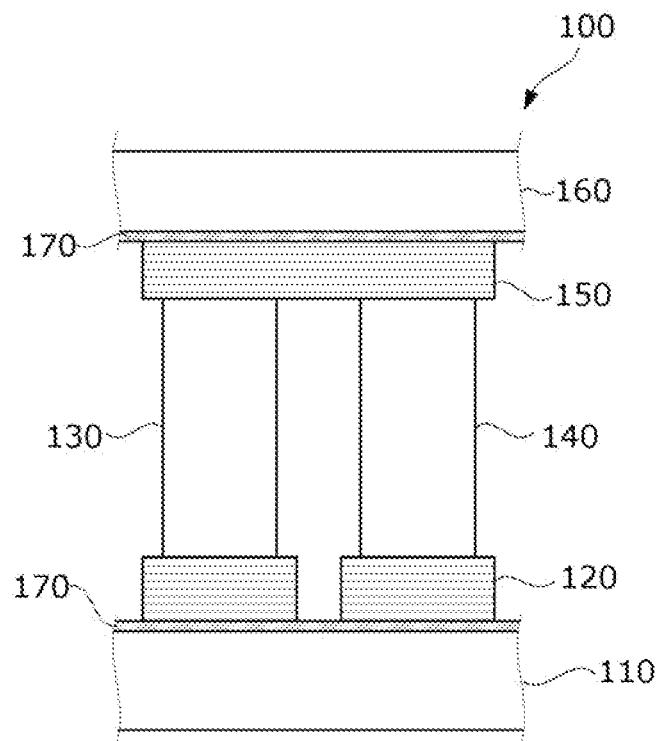

[FIG. 7]
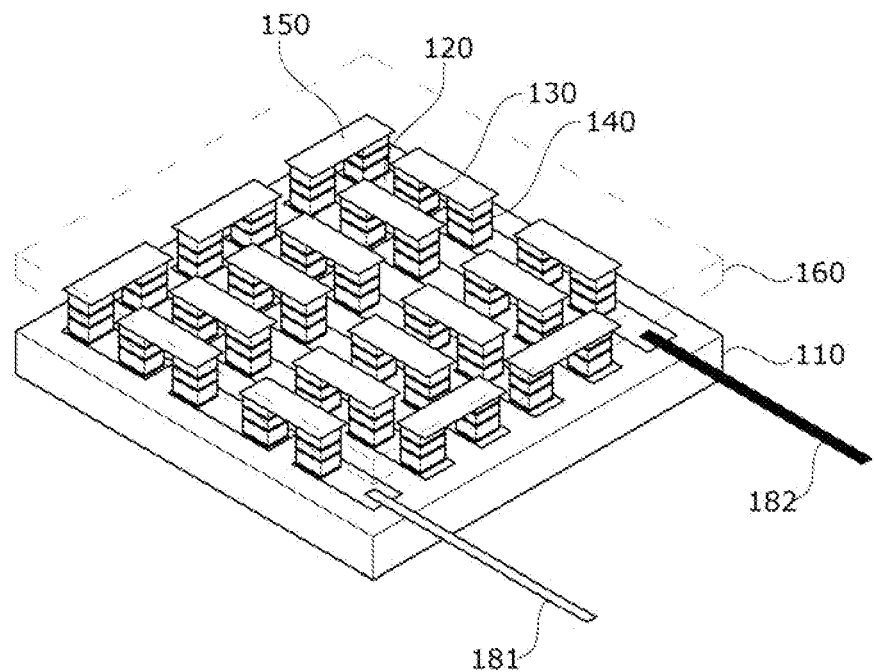

[FIG. 8]
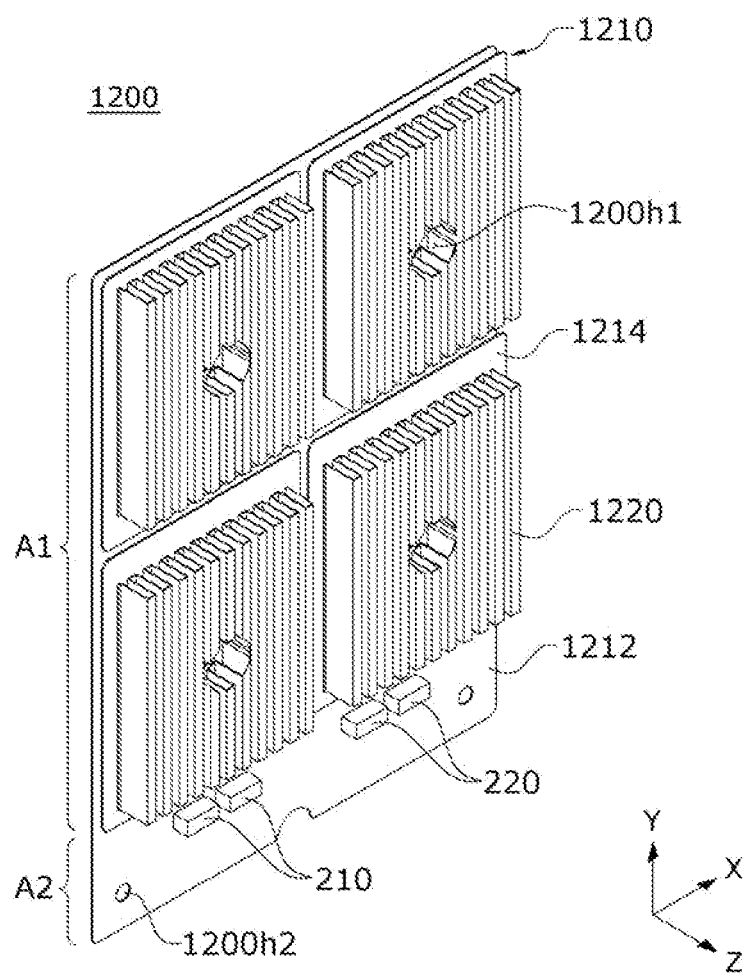

[FIG. 9]
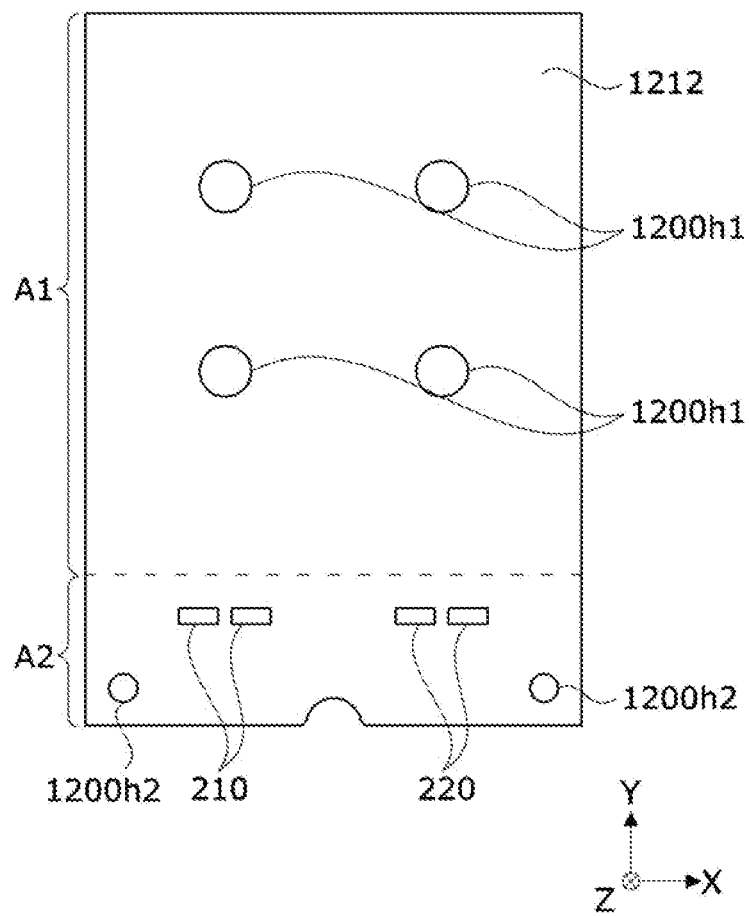
[FIG. 10]
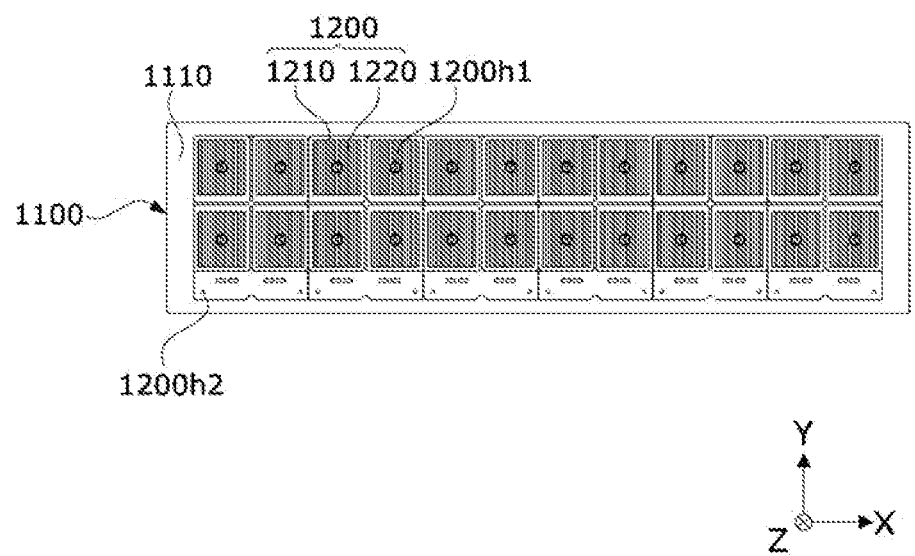

[FIG. 11]
(a)
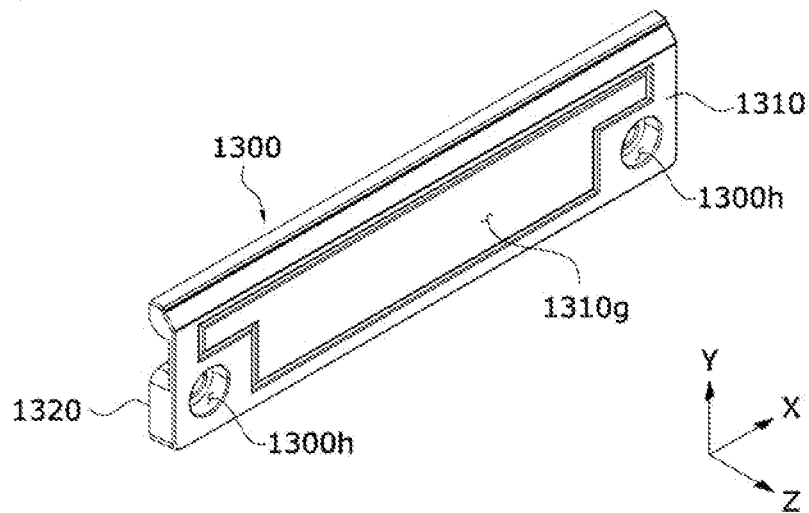
(b)
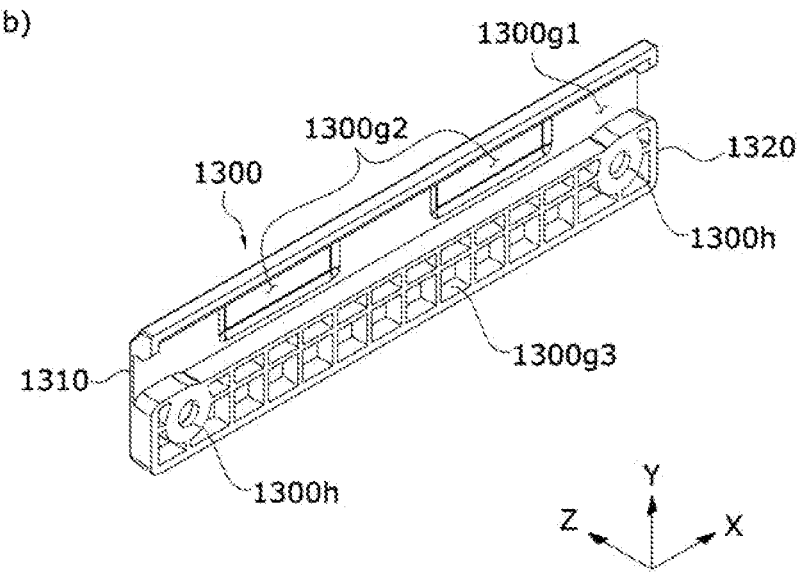

[FIG. 12]
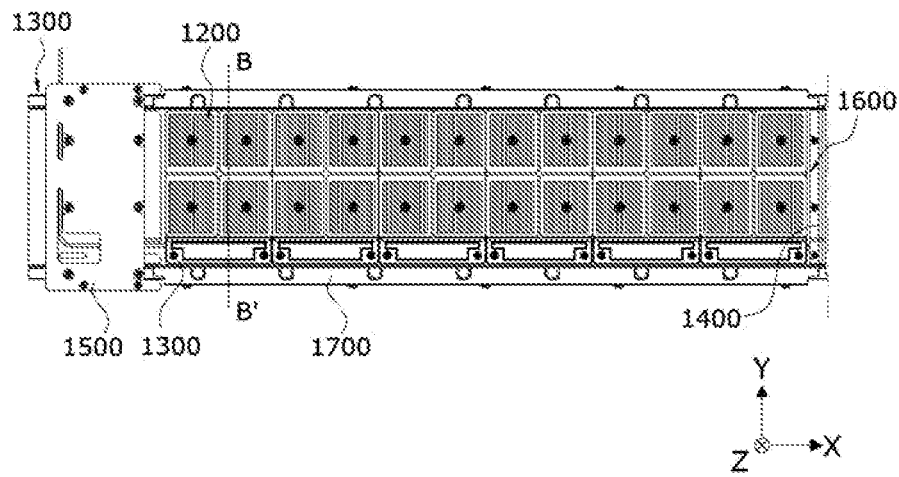
[FIG. 13]
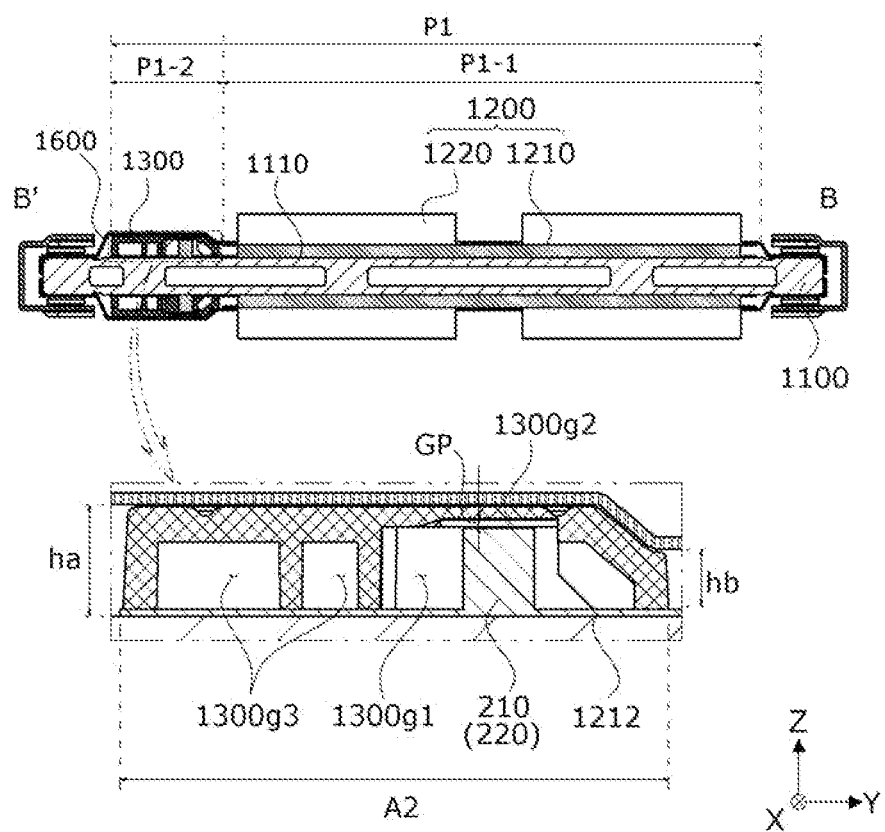

[FIG. 14]
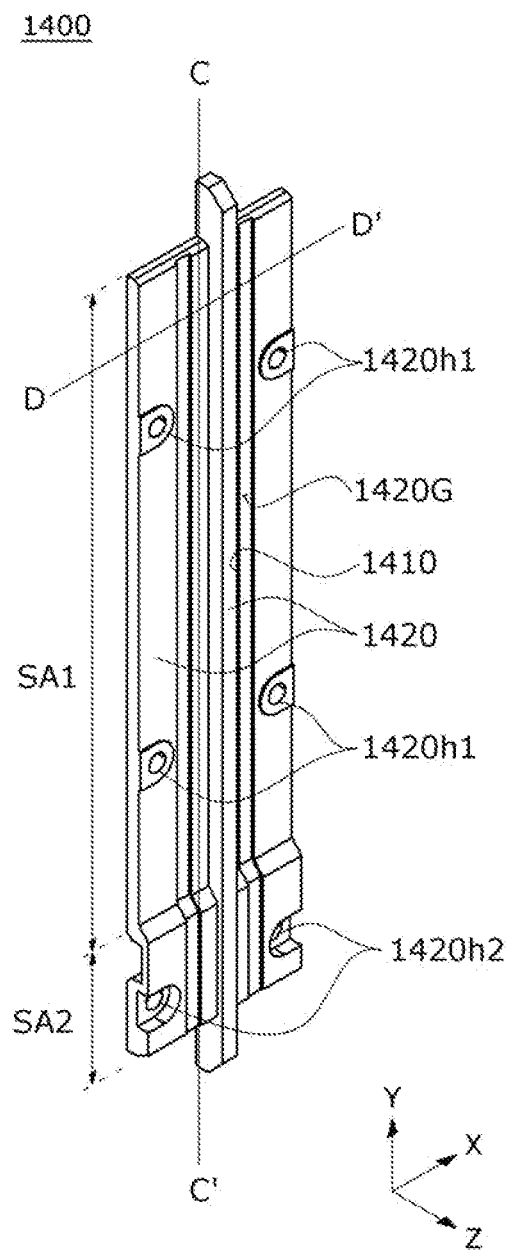

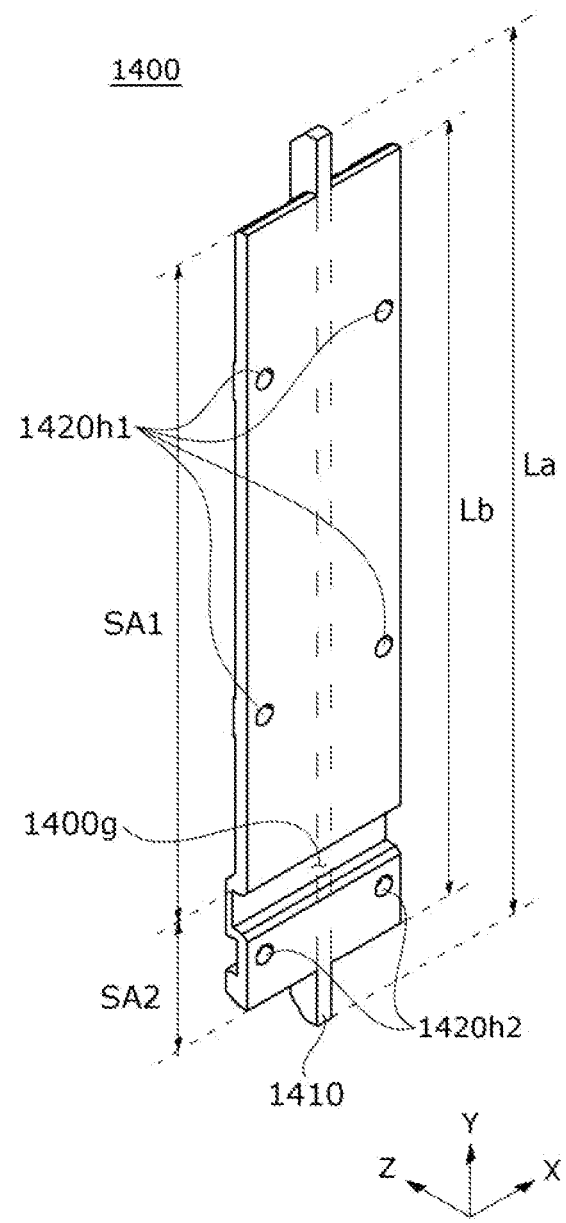
[FIG. 15]

[FIG. 16]
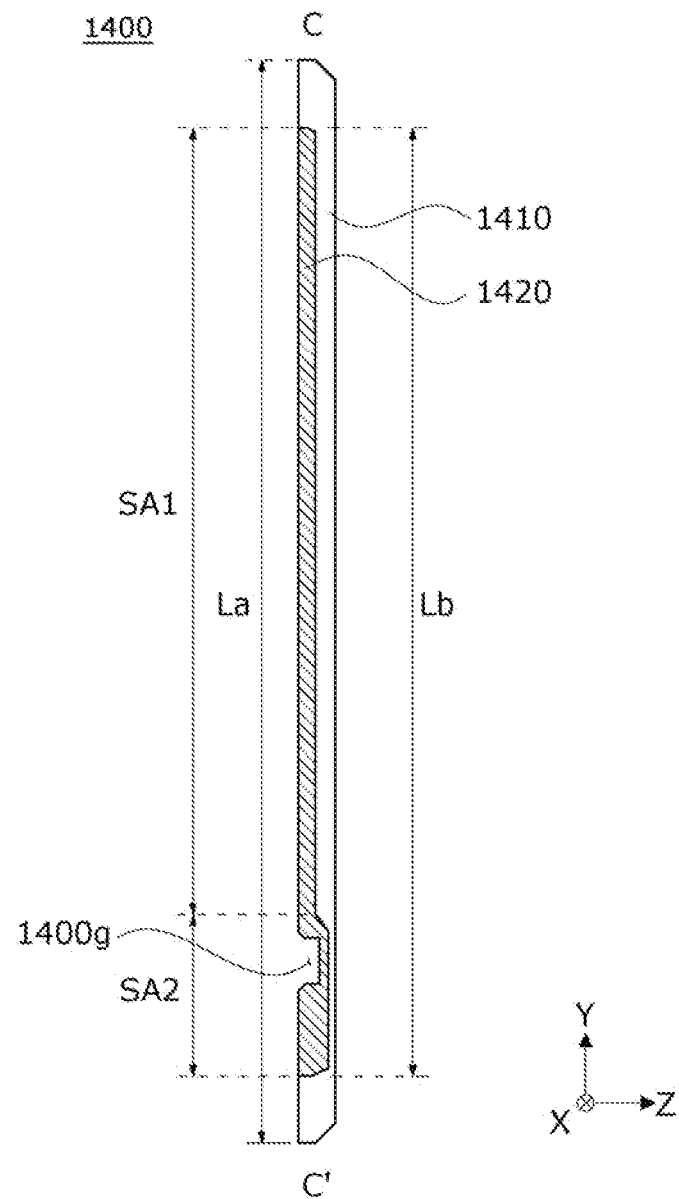

[FIG. 17]
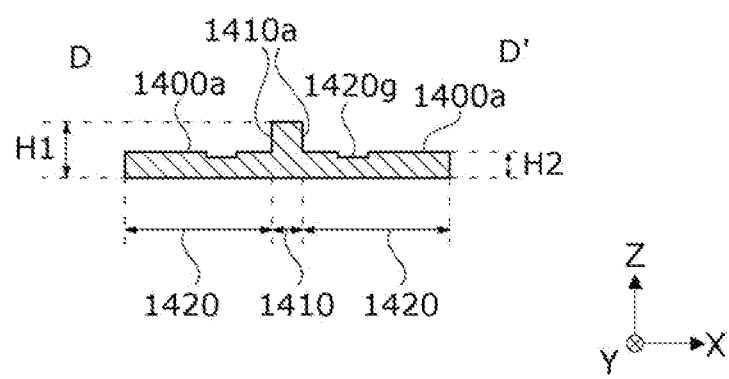

[FIG. 18]
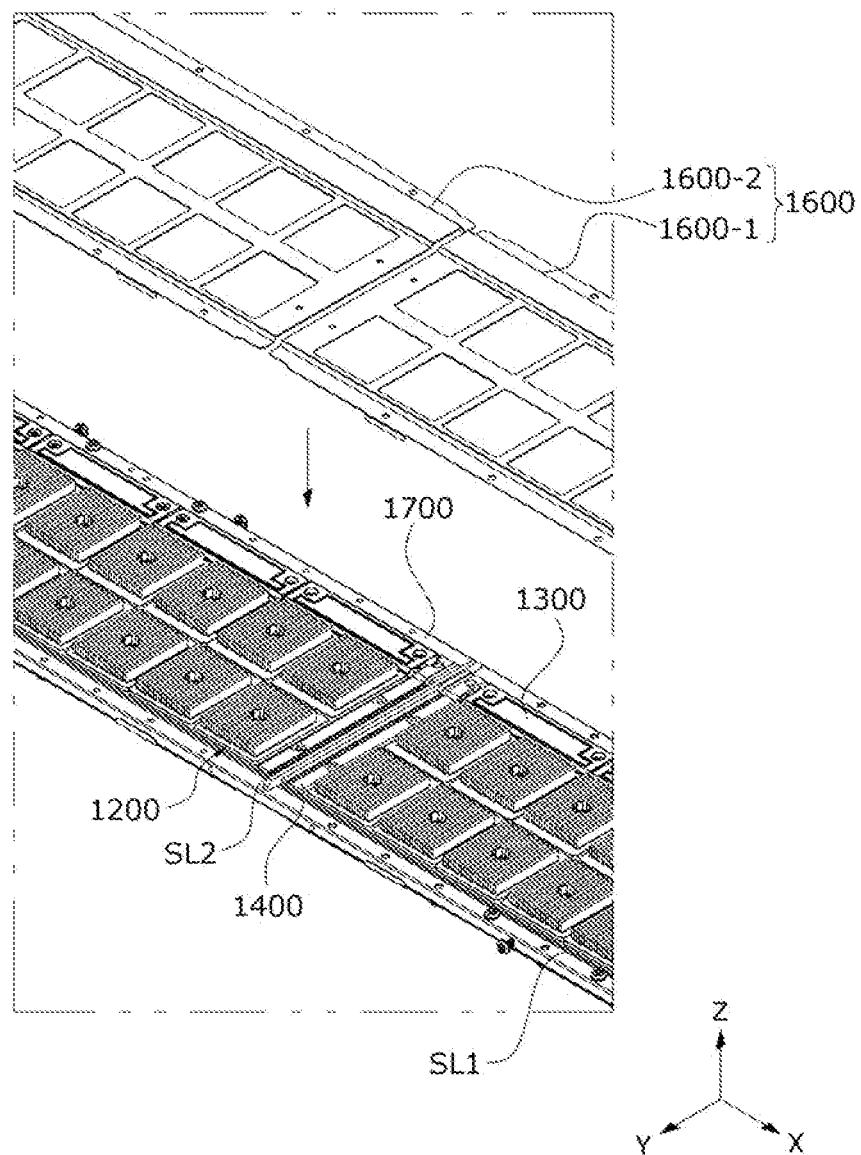

[FIG. 19]
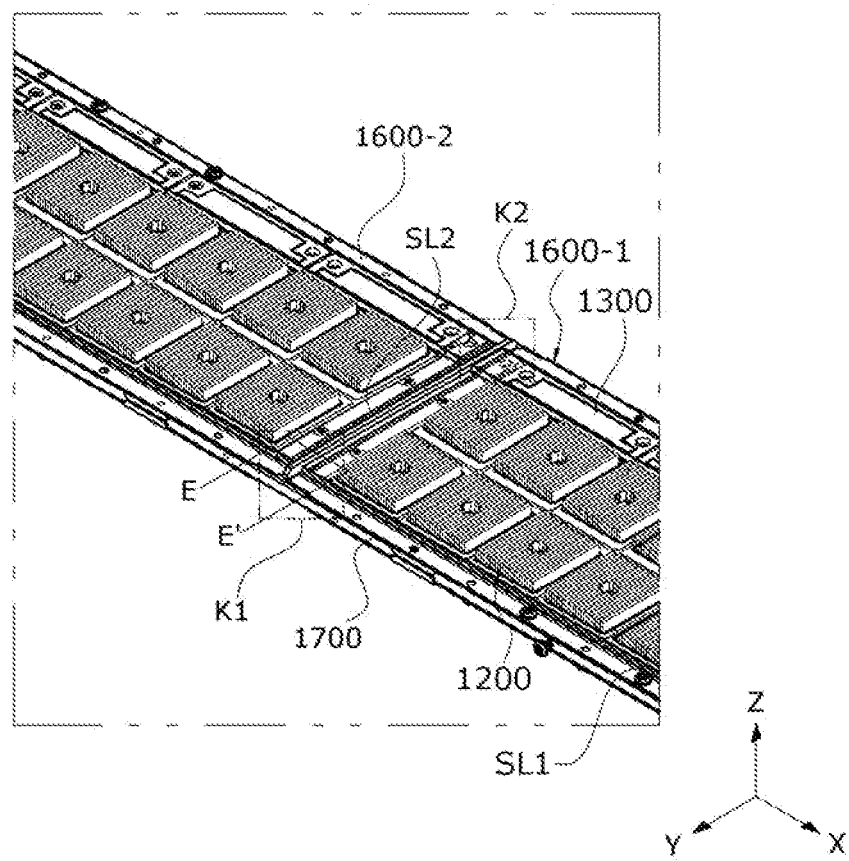
[FIG. 20]
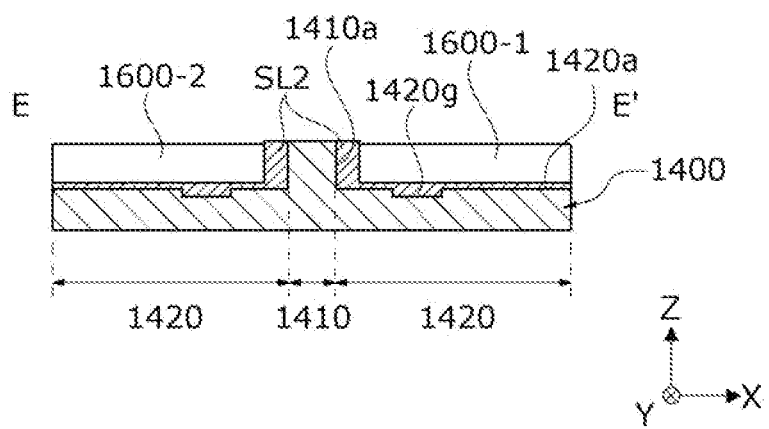

[FIG. 21]
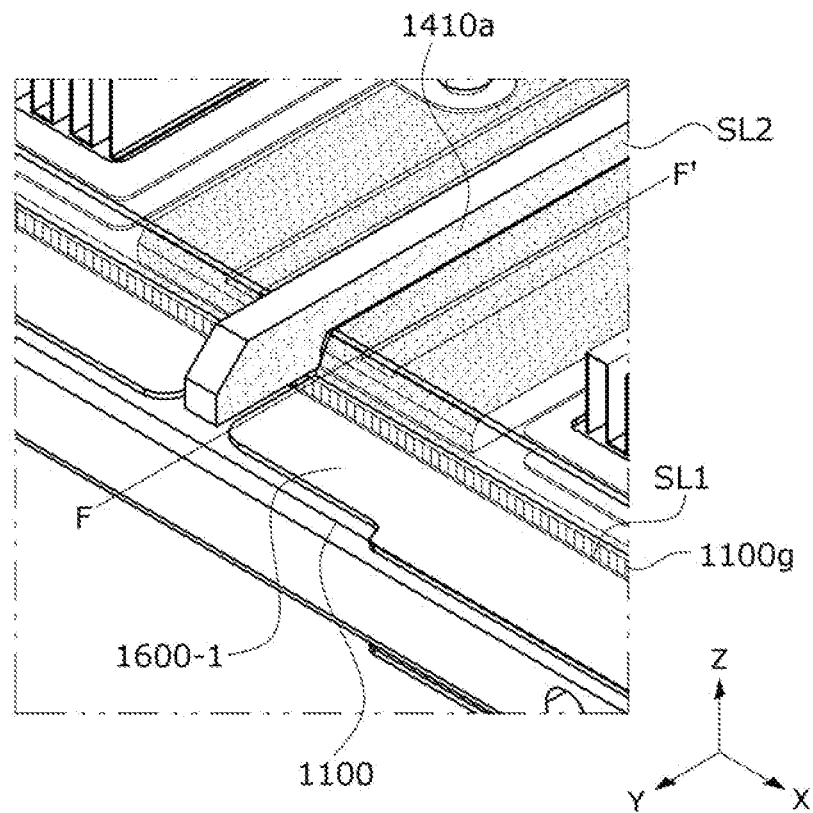
[FIG. 22]
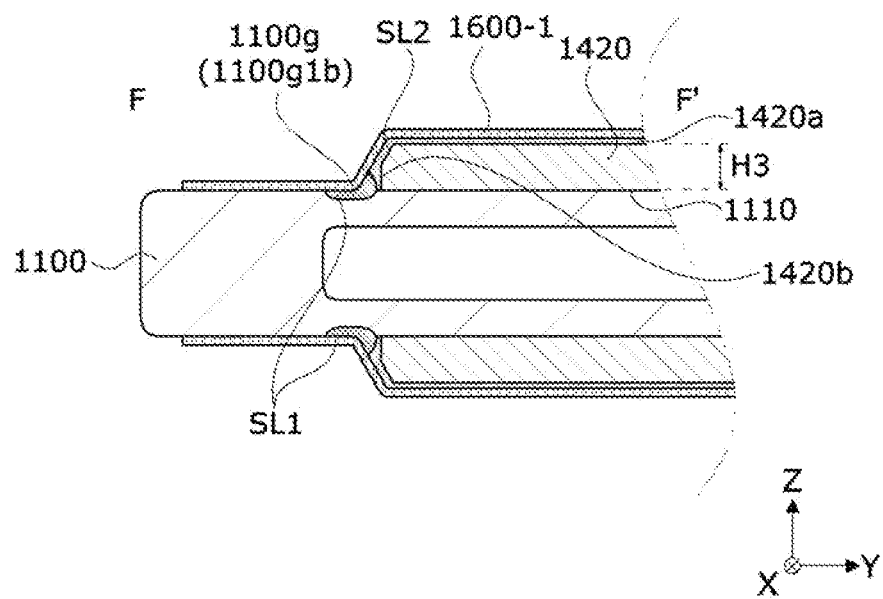

[FIG. 23]
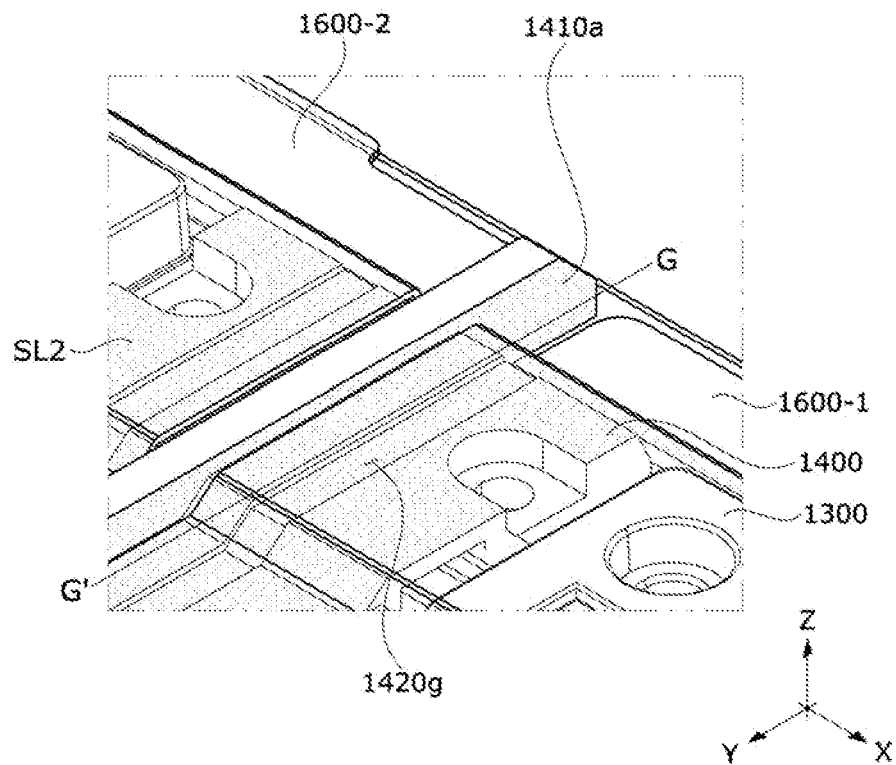
[FIG. 24]
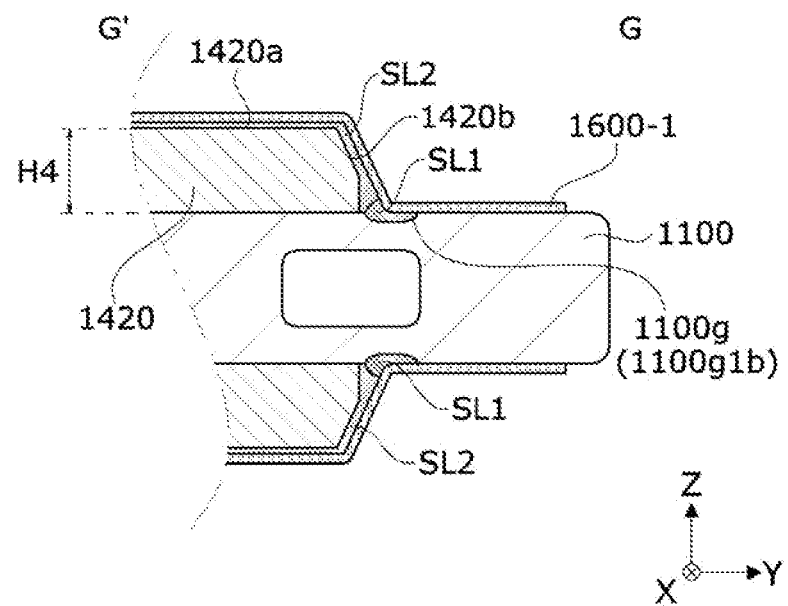

[FIG. 25]
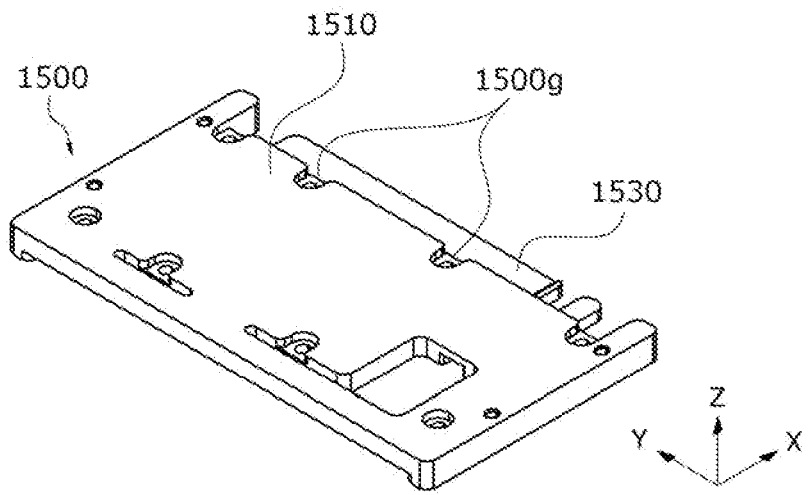
[FIG. 26]
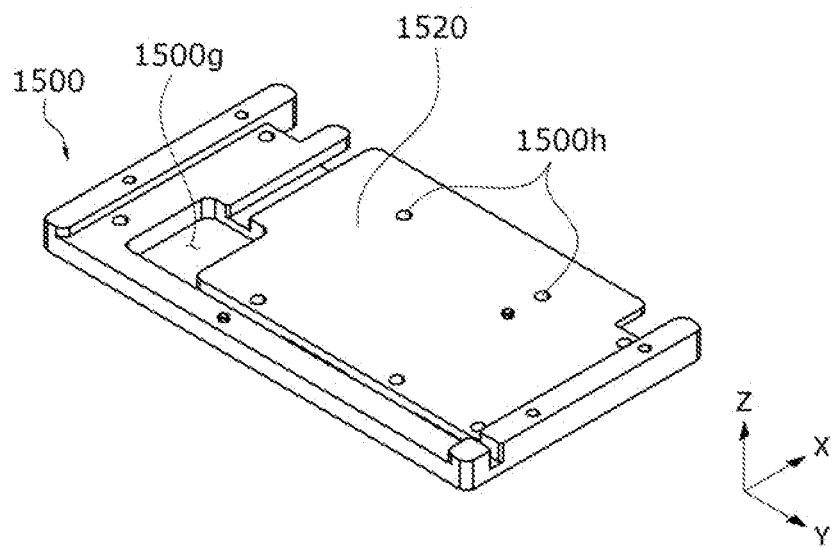

[FIG. 27]
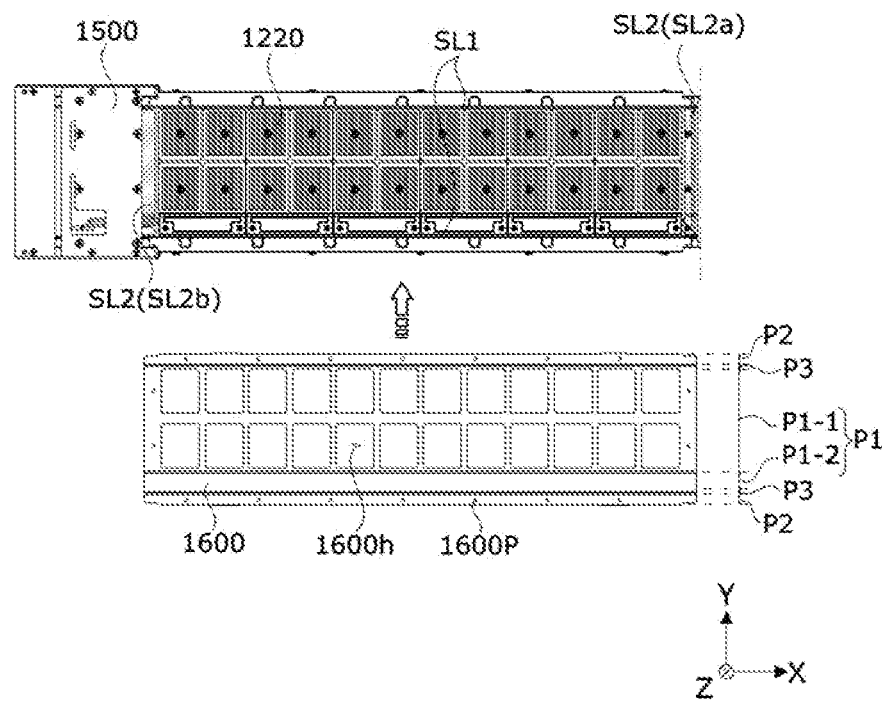

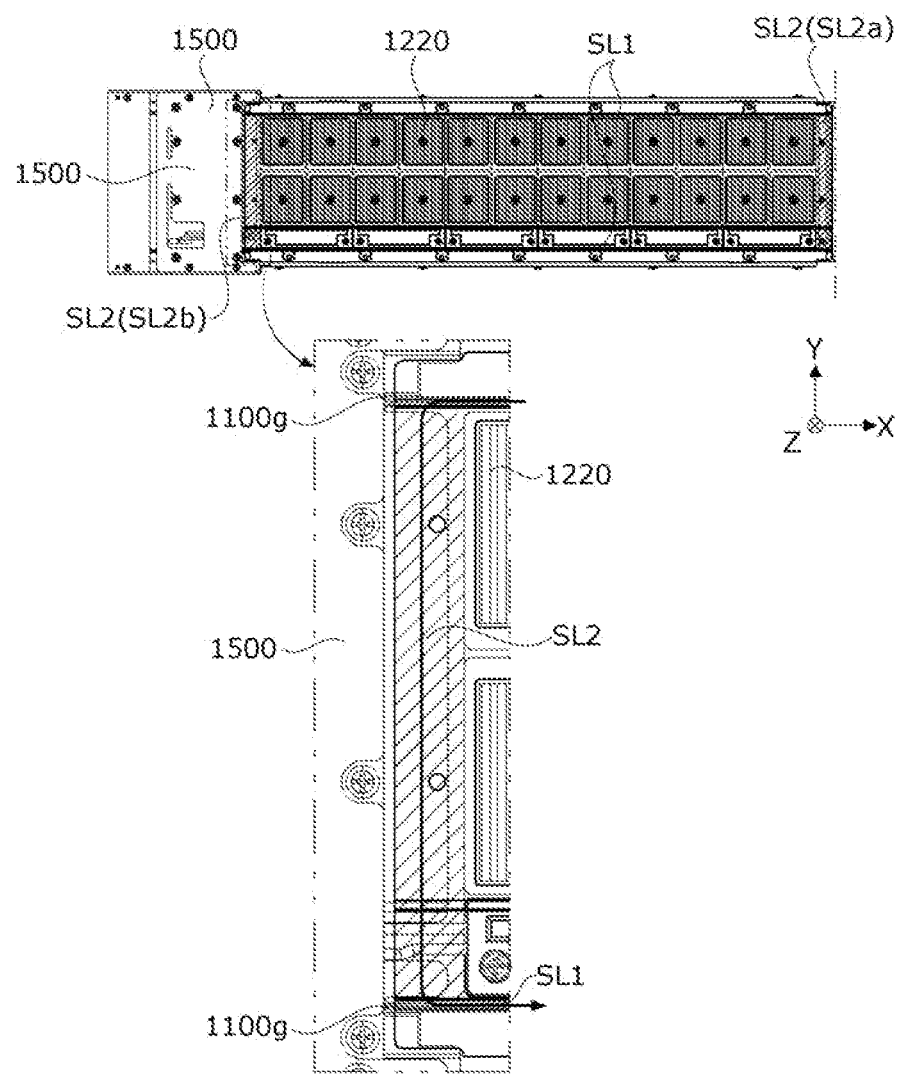
[FIG. 28]

[FIG. 29]
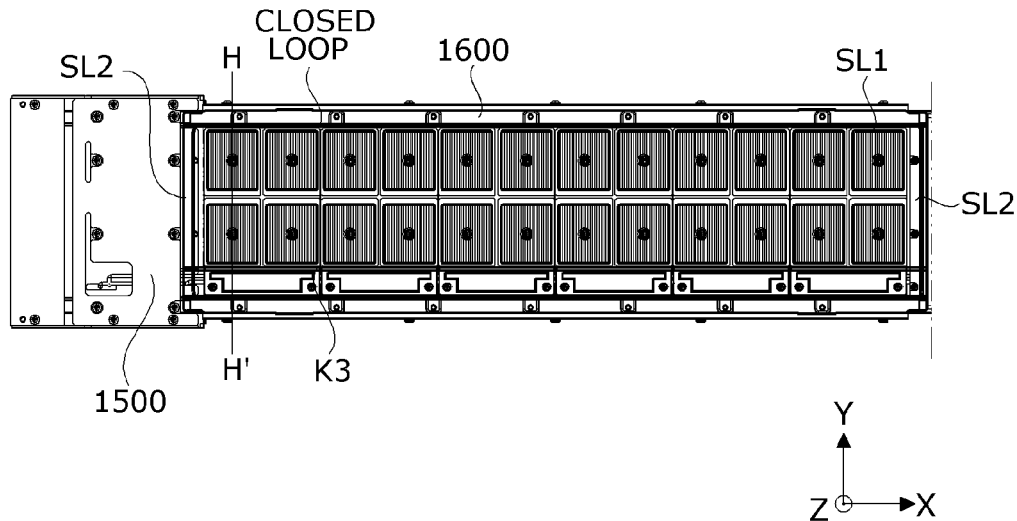
[FIG. 30]
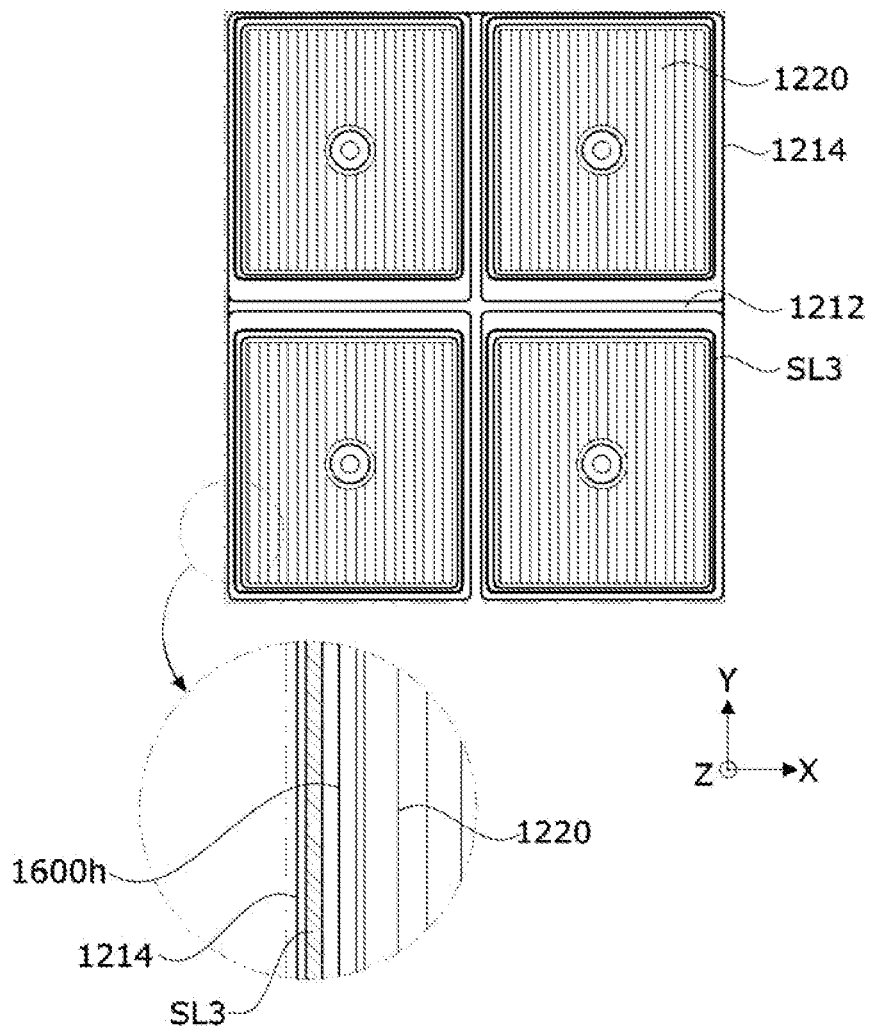

[FIG. 31]
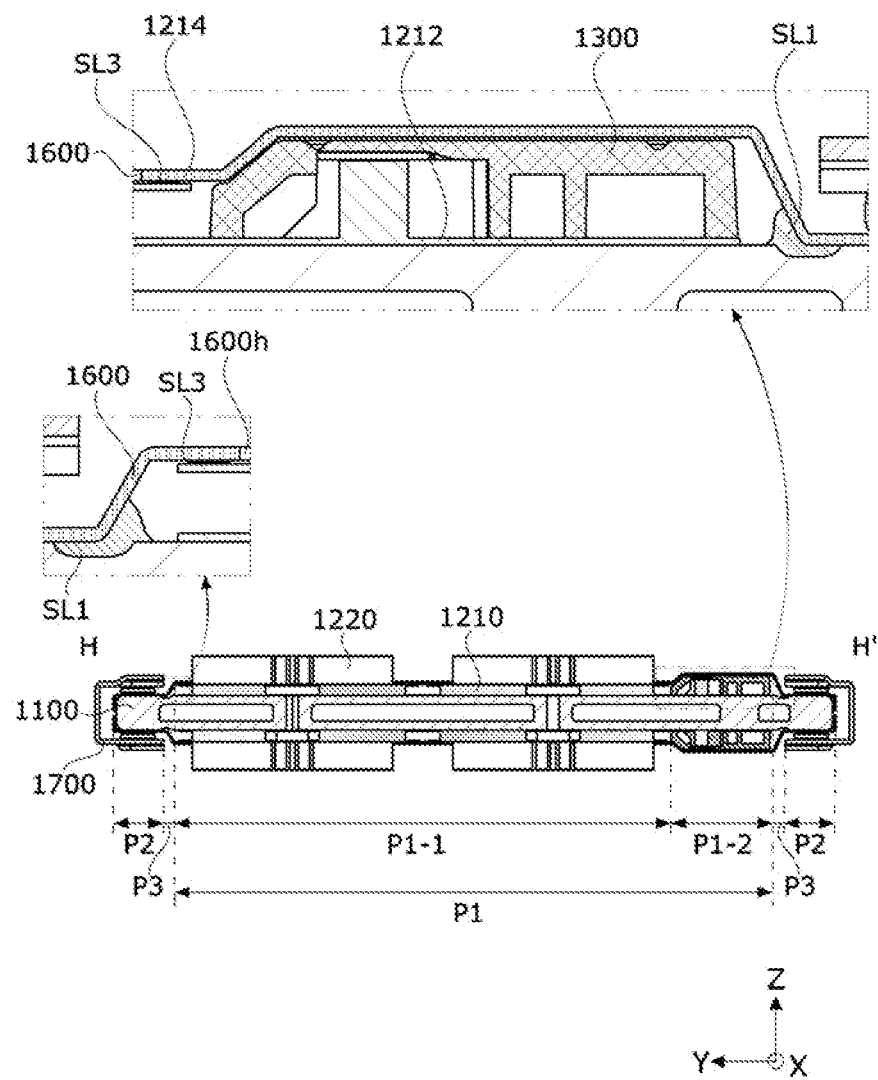

THERMOELECTRIC MODULE AND POWER GENERATION DEVICE INCLUDING SAME

CROSS REFERENCE TO RELATED APPLICATIONS

This application is the National Phase of PCT/KR2021/012398 filed on Sep. 13, 2021, which claims priority under 35 U.S.C. § 119 (a) to Patent Application No. 10-2020-0119804, filed in the Republic of Korea on Sep. 17, 2020, all of which are hereby expressly incorporated by reference into the present application.

TECHNICAL FIELD

The present invention relates to a thermoelectric module and a power generation device including the same, and more specifically, to a thermoelectric module and a power generation device including the same, which use a temperature difference between a low-temperature part and a high-temperature part of a thermoelectric element or a thermoelectric device (in particular, a Seebeck device) for cooling or heating a specific target such as a fluid.

BACKGROUND ART

A thermoelectric phenomenon is a phenomenon caused by the movement of electrons and holes inside a material and means a direct energy conversion between heat and electricity.

A thermoelectric element is a generic term for an element using the thermoelectric phenomenon and has a structure in which a P-type thermoelectric material and an N-type thermoelectric material are bonded between metal electrodes to form a PN junction pair.

The thermoelectric element may be classified into an element using a change in electrical resistance according to temperature, an element using the Seebeck effect which is a phenomenon in which an electromotive force is generated by a temperature difference, an element using the Peltier effect which is a phenomenon in which heat absorption or heat generation occurs due to a current or the like.

Thermoelectric elements are variously applied to home appliances, electronic parts, communication parts, etc. For example, the thermoelectric elements may be applied to cooling devices, heating devices, power generation devices, etc. Therefore, the demand for thermoelectric performance of the thermoelectric element is gradually increasing.

Recently, there is a need to generate electricity using thermoelectric elements and hot waste heat generated from engines of automobiles, vessels, etc.

In this case, a fluid movement part through which a first fluid passes may be disposed on a low-temperature part of the thermoelectric element, a heat sink may be disposed on a high-temperature part of the thermoelectric element, and a second fluid may pass through a heat sink. Therefore, electricity may be generated by a temperature difference between the low-temperature part and the high-temperature part of the thermoelectric element.

Technical Problem

An embodiment of the present invention is directed to providing a thermoelectric module and a power generation device including the same, which generate power using a temperature difference between a low-temperature part and a high-temperature part of a thermoelectric element.

In addition, an embodiment of the present invention may provide a thermoelectric module and a power generation device including the same, which have improved moisture resistance even when a size increases.

In addition, an embodiment of the present invention may provide a thermoelectric module, in which long thermoelectric modules are disposed in parallel to improve power generation performance, and a power generation device including the same.

The object of embodiments is not limited thereto and may also include objects or effects that may be identified from the configurations or embodiments to be described below.

Technical Solution

A thermoelectric device according to one embodiment of the present invention includes a fluid movement part including a groove portion extending in a first direction in one surface thereof, a thermoelectric module disposed on the one surface, and a shield member disposed on the thermoelectric module, wherein the shield member includes a first part overlapping the thermoelectric module in a vertical direction, a second part misaligned with the thermoelectric module in the vertical direction, and a stepped part configured to connect the first part and the second part, the second part is closer to the one surface of the fluid movement part than the first part is, and the groove portion of the fluid movement part overlaps at least one of the second part and the stepped part in the vertical direction.

The groove portion of the fluid movement part may be disposed under a boundary at which the second part is in contact with the stepped part.

The thermoelectric device may further include a first sealing member disposed in the groove portion of the fluid movement part, and a second sealing member at least partially connected to the first sealing member.

The thermoelectric module may be positioned inside the first sealing member and the second sealing member under the shield member.

The second sealing member may be provided as plurality of second sealing members disposed to be spaced apart from each other in the first direction, and the first sealing member may be provided as a plurality of first sealing members disposed to be spaced apart from each other in a second direction perpendicular to the first direction.

The thermoelectric module may be disposed between the plurality of second sealing members and between the plurality of first sealing members.

The first part may have a height from the one surface of the fluid movement part that is greater than a height between the second part and the one surface of the fluid movement part.

The first part may include a plurality of shield holes, the thermoelectric module may include a thermoelectric element in contact with the one surface of the fluid movement part and a heat sink disposed on the thermoelectric element, and the heat sink may pass through the plurality of shield holes.

The first part may include a 1-1 part overlapping the thermoelectric module in the vertical direction and a 1-2 part misaligned with the thermoelectric element in the vertical direction, and a height between the 1-2 part and the one surface of the fluid movement part may be greater than a height between the 1-1 part and the one surface of the fluid movement part.

The thermoelectric module may further include a connector disposed at one side of the thermoelectric element and connected to the thermoelectric element, and the connector may overlap the 1-1 part in the vertical direction.

The groove portion of the fluid movement part may include a 1-1 groove and a 1-2 groove disposed to be spaced apart from each other in a second direction perpendicular to the first direction, and a minimum separation distance between the 1-1 groove and the thermoelectric element in the second direction may be different from a minimum separation distance between the 1-2 groove and the thermoelectric element in the second direction.

The thermoelectric device may further include a third sealing member disposed between the thermoelectric element and the first part.

The thermoelectric element may include a first substrate in contact with the one surface of the fluid movement part, a second substrate disposed to be spaced apart from the first substrate, a first electrode disposed on the first substrate, a second electrode disposed under the second substrate, and a plurality of thermoelectric legs disposed between the first electrode and the second electrode, and the third sealing member may overlap the first substrate in the vertical direction.

The third sealing member may be disposed to be spaced apart from the first sealing member or the second sealing member.

The third sealing member may extend toward the first sealing member or the second sealing member along the stepped part, and a distance between the one surface of the fluid movement part and the shield member may gradually increase from the second part toward the first part.

Advantageous Effects

According to the embodiments of the present invention, it is possible to obtain a power generation device with simple assembly and excellent power generation performance.

In addition, according to the embodiments of the present invention, it is possible to implement a thermoelectric module and a power generation device including the same which have improved moisture resistance even when a size increases.

In particular, it is possible to provide a thermoelectric module which has a shield member and a sealing member and thus is protected from moisture, heat, or other contaminants, and a power generation device including the same.

In addition, it is possible to provide a thermoelectric module, of which unit areas show high power generation efficiency, and a power generation device including the same.

Various and beneficial advantages and effects of the present invention are not limited to the above description and will be more easily understood in a process of describing specific embodiments of the present invention.

DESCRIPTION OF DRAWINGS

FIG. 1 is a perspective view of a power generation device according to an embodiment of the present invention.

FIG. 2 is an exploded perspective view of the power generation device according to the embodiment of the present invention.

FIG. 3 is a perspective view of a fluid movement part of the power generation device according to the embodiment of the present invention.

FIG. 4 is another perspective view of the fluid movement part of the power generation device according to the embodiment of the present invention.

FIG. 5 is a cross-sectional view of the power generation device along line A-A" in FIG. 1.

FIGS. 6 and 7 are views showing a thermoelectric element according to one embodiment of the present invention.

FIG. 8 is a perspective view of a thermoelectric module included in the power generation device according to the embodiment of the present invention.

FIG. 9 is a top view of a first substrate of the thermoelectric module included in the power generation device according to the embodiment of the present invention.

FIG. 10 is a top view in which a plurality of thermoelectric modules are disposed on one surface of the fluid movement part included in the power generation device according to the embodiment of the present invention.

FIG. 11 is a perspective view of a cover member included in the power generation device according to the embodiment of the present invention.

FIG. 12 is a view showing the power generation device according to the embodiment of the present invention and a cover member coupled to the power generation device.

FIG. 13 is a cross-sectional view of the power generation device along line B-B" in FIG. 12.

FIGS. 14 and 15 are perspective views of a guide part included in the power generating device according to the embodiment of the present invention.

FIG. 16 is a view of the guide part along line C-C' in FIG. 14.

FIG. 17 is a cross-sectional view of the guide part along line D-D' in FIG. 14.

FIGS. 18 and 19 are views for describing a shield member being coupled in the power generation device according to the embodiment of the present invention.

FIG. 20 is a cross-sectional view of the shield member being coupled along line E-E" in FIG. 19.

FIG. 21 is an enlarged view of portion K1 in FIG. 19.

FIG. 22 is a cross-sectional view of portion K1 along line F-F" in FIG. 21.

FIG. 23 is an enlarged view of portion K2 in FIG. 19.

FIG. 24 is a cross-sectional view of portion K2 along line G-G' in FIG. 23.

FIGS. 25 and 26 are perspective views of a dummy module included in the power generation device according to the embodiment of the present invention.

FIGS. 27 and 28 are views for describing the shield member being coupled in the power generation device according to the embodiment of the present invention.

FIG. 29 is a view for describing positions of a first sealing member, a second sealing member, and a third sealing member in the power generation device according to the embodiment of the present invention.

FIG. 30 is an enlarged view of portion K3 in FIG. 29.

FIG. 31 is a cross-sectional view showing the first sealing member, the second sealing member, and the third sealing member along line H-H' in FIG. 29.

MODES OF THE INVENTION

Hereinafter, exemplary embodiments of the present invention will be described in detail with reference to the accompanying drawings.

However, the technical spirit of the present invention is not limited to some embodiments to be described but may be implemented in various different forms, and one or more components in the embodiments may be selectively coupled to and substituted with each other as long as the one or more components are within the scope of the technical spirit of the present invention.

In addition, terms (including technical and scientific terms) used in the embodiments of the present invention may be construed as the meaning that can be generally understood by those skilled in the art to which the present invention pertains unless explicitly specifically defined and described, and the meaning of commonly used terms, such as terms defined in a dictionary, may be construed in consideration of contextual meanings of related technologies.

In addition, the terms used in the embodiments of the present invention are to describe the embodiments and are not intended to limit the present invention.

In the specification, the singular form may also include the plural form unless otherwise specified in the phrase, and when described as "at least one (or one or more) of A, B, and C," this may include one or more of all possible combinations of A, B, and C.

In addition, terms, such as first, second, A, B, (a), and (b), may be used to describe the components of the embodiments of the present invention.

These terms are only used to distinguish the component from another component, and the nature, order, sequence, etc. of the corresponding component are not limited by the terms.

In addition, when a certain component is described as being "connected," "coupled," or "joined" to another component, the certain component may include not only a case of being directly connected, coupled, or connected to another component, but also a case of being "connected," "coupled," or "joined" to another component with other components interposed between the certain component and another component.

In addition, when a certain component is described as being formed or disposed on "top (above) or bottom (below)" of each component, the top (above) or bottom (below) includes not only a case in which two components are in direct contact with each other but also a case in which one or more other components are formed or disposed between the two components. In addition, when expressed as "top (above) or bottom (below)," this may also include the meaning of not only an upward direction but also a downward direction with respect to one component.

First, a thermoelectric device (or a power generation device) according to the present invention may be used in a power generation system including a thermoelectric module. For example, the power generation device (including the thermoelectric module or a thermoelectric element as the thermoelectric device) may include a path or a tube through which a fluid moves. In addition, the power generation device may be variously applied according to a temperature difference between a low-temperature part and a high-temperature part of the thermoelectric element.

FIG. 1 is a perspective view of a power generation device according to an embodiment of the present invention, and FIG. 2 is an exploded perspective view of the power generation device according to the embodiment of the present invention.

Referring to FIGS. 1 and 2, a thermoelectric device 1000 (or 'power generation device') includes a fluid movement part 1100, a thermoelectric module 1200, a cover member 1300, a guide part 1400, a dummy module 1500, a shield member 1600, a fixing member 1700, and a case 1800. Furthermore, the thermoelectric device 1000 according to the embodiment may further include an electric wire electrically connected to the thermoelectric module 1200 and, as will be described below, may further include various elements, such as a screw, as a fastening member for coupling between components. In addition, the thermoelectric device 1000 according to the embodiment may be provided as a plurality of thermoelectric devices 1000 disposed to be spaced a predetermined distance from each other and disposed side by side (e.g., in parallel) to form a power generation system.

In addition, the thermoelectric device 1000 according to the embodiment may generate power through the thermoelectric module 1200 using a temperature difference between a first fluid flowing through an inside of the fluid movement part 1100 and a second fluid passing an outside of the fluid movement part 1100.

Specifically, the first fluid introduced into the fluid movement part 1100 may be water, but is not limited thereto, and may be various types of fluids (e.g., gases) having cooling performance. In addition, a temperature of the first fluid introduced into the fluid movement part 1100 may be lower than 100° C., preferably, lower than 50° C., and more preferably, lower than 40° C., but is not limited thereto, and the first fluid may be a fluid having a lower temperature than the second fluid. A temperature of the first fluid discharged after passing through the fluid movement part 1100 may be higher than the temperature of the first fluid introduced into the fluid movement part 1100.

The first fluid may be introduced from a fluid inlet disposed at one side of the fluid movement part 1100 and discharged through a fluid outlet disposed at the other side facing the one side. In order to facilitate the introduction and discharge of the first fluid and support the fluid movement part 1100, an inlet flange JI and an outlet flange (not shown) may be further provided at a fluid inlet side and a fluid outlet side of the fluid movement part 1100, respectively.

Meanwhile, the second fluid may pass the outside of the fluid movement part 1100, for example, a heat sink of the thermoelectric module 1200 disposed outside the fluid movement part 1100. The second fluid may include waste heat generated from engines, such as automobiles and ships, but is not limited thereto. For example, a temperature of the second fluid may be 100° C. or higher, preferably, 200° C. or higher, and more preferably, in a range of 220° C. to 250° C., but is not limited thereto, and the second fluid may be a fluid having a higher temperature than the first fluid.

In the specification, an example in which the temperature of the first fluid flowing through the inside of the fluid movement part 1100 is lower than the temperature of the second fluid passing the heat sink 1220 of the thermoelectric module 1200 disposed outside the fluid movement part 1100 will be described. Therefore, in the specification, the fluid movement part 1100 may be referred to as a duct or a cooling part. However, the embodiments of the present invention are not limited thereto, and the temperature of the first fluid flowing through the inside of the fluid movement part 1100 may be higher than the temperature of the second fluid passing the heat sink 1220 of the thermoelectric module 1200 disposed outside the fluid movement part 1100.

In addition, in the specification, the first fluid may move in a first direction (X-axis direction), and a flow path of the fluid movement part 1100 may also extend in the first direction. In addition, a second direction (Y-axis direction) may correspond to a moving direction of the second fluid in a direction perpendicular to the first direction (X-axis direction). In addition, a third direction (Z-axis direction) as a vertical direction may be a direction perpendicular to both the first direction (X-axis direction) and the second direction (Y-axis direction). The third direction (Z-axis direction) may be used interchangeably with the vertical direction and may correspond to a direction from a lower thermoelectric module to an upper thermoelectric module with respect to the fluid movement part 1100.

The thermoelectric module 1200 may be disposed on the fluid movement part 1100. In addition, the thermoelectric module 1200 may be provided as a plurality of thermoelectric modules 1200 that may be disposed on one surfaces, that is, each of an upper surface and a lower surface of the fluid movement part 1100. Here, the upper surface is an outer surface disposed in the third direction or the vertical direction, and the lower surface is an outer surface disposed in a direction opposite to the third direction. Furthermore, the thermoelectric modules 1200 may be positioned to correspond to each other with respect to the fluid movement part 1100. For example, the thermoelectric module 1200 under the fluid movement part 1100 may overlap the thermoelectric module 1200 on the fluid movement part 1100 in the third direction (Z-axis direction). Hereinafter, the thermoelectric module 1200, the cover member 1300, the guide part 1400, the dummy module 1500, the shield member 1600, and the case 1800 based on the upper surface of the fluid movement part 1100 unless otherwise specified will be described.

In addition, the thermoelectric module 1200 according to the embodiment of the present invention may include a thermoelectric element and a heat sink disposed on the thermoelectric element. Therefore, as described above, the thermoelectric module 1200 may generate electricity by the Seebeck effect generated by the temperature difference between the first fluid and the second fluid. The thermoelectric element of the thermoelectric module 1200 may have a structure of the thermoelectric element shown in FIGS. 6 and 7. A detailed description thereof will be given below.

The thermoelectric module 1200 may be provided as a plurality of thermoelectric modules 1200 disposed on the upper surface and the lower surface of the fluid movement part 1100. For example, as shown in FIG. 2, the thermoelectric module 1200 may include a first thermoelectric module 1200-1 to a $12^{th}$ thermoelectric module 1200-12. As described above, although 12 thermoelectric modules 1200 are shown, this is illustrative, and the present invention is not limited to this number.

In addition, six thermoelectric modules (e.g., 1200-1 to 1200-6) corresponding to the guide part 1400 or the shield member 1600 may form one first thermoelectric module group 1200a, and six thermoelectric modules (e.g., 1200-7 to 1200-12) disposed to be spaced apart from each other in the first direction (X-axis direction) may form another second thermoelectric module group 1200b. Hereinafter, a case of one shield member (e.g., 1600-1) for shielding six thermoelectric modules will be described. However, as described above, the number of thermoelectric modules 1200 may be variously changed depending on a size of the shield member 1600, a size of the fluid movement part 1100, etc.

In addition, in the specification, the first direction (X-axis direction) may correspond to an arrangement direction of the plurality of thermoelectric modules 1200. In other words, the plurality of thermoelectric modules 1200 may be disposed side by side to overlap each other in the first direction (X-axis direction).

As will be described below, the thermoelectric element of the thermoelectric module 1200 includes a first substrate disposed in contact with the fluid movement part 1100, a plurality of first electrodes disposed on the first substrate, a plurality of thermoelectric legs disposed on the plurality of first electrodes, a plurality of second electrodes disposed on the plurality of thermoelectric legs, and a second substrate disposed on the plurality of second electrodes, and a heat sink is disposed on the second substrate. Insulating layers may be further disposed between the first substrate and the plurality of first electrodes and between the plurality of second electrodes and the second substrate.

In addition, the first substrate of the thermoelectric element disposed on the fluid movement part 1100 may be a metal substrate, and the metal substrate may be bonded to a surface of the fluid movement part 1100 by a thermal interface material (TIM) (not shown). Since the metal substrate has excellent heat transfer performance, heat transfer between the thermoelectric element and the fluid movement part 1100 is easy. In addition, when the metal substrate and the fluid movement part 1100 are bonded using the TIM, the heat transfer between the metal substrate and the fluid movement part 1100 may not be hindered. Here, the metal substrate may be one of a copper substrate, an aluminum substrate, and a copper-aluminum substrate, but is not limited thereto. A detailed description of the thermoelectric element will be described below.

Each of the plurality of thermoelectric modules 1200 may include a connector for extracting generated electricity to the outside or providing electricity generated from the Seebeck effect.

In this case, the cover member 1300 may be disposed on the connector of the thermoelectric module 1200. Therefore, the cover member 1300 may protect the connector of the thermoelectric module 1200.

In addition, the cover member 1300 may be coupled to the thermoelectric module 1200 and the fluid movement part 1100 by a screw, a screw, a bonding member, etc., thereby increasing a coupling force between the fluid movement part 1100 and the thermoelectric module 1200. Furthermore, the cover member 1300 may be coupled to the fluid movement part 1100 and the shield member 1600 through a bonding member, a screw, etc., thereby increasing a coupling force between the shield member 1600, the cover member 1300, the thermoelectric module 1200, and the fluid movement part 1100.

The cover member 1300 may be disposed on the first substrate of the thermoelectric element in the thermoelectric module 1200. For example, the cover member 1300 may be disposed on a region (hereinafter, corresponding to a second region) in which the first substrate of the thermoelectric element does not overlap the second substrate. In addition, the connector of the thermoelectric module and the cover member 1300 may be disposed on the region in which the first substrate does not overlap the second substrate.

In addition, a plurality of cover members 1300 may be formed to correspond to the thermoelectric module 1200. For example, in the thermoelectric device 1000, the number of cover members 1300 may be the same as the number of thermoelectric modules. For example, the plurality of cover members may include a first cover member 1300-1 to a $12^{th}$ cover member 1300-12 and may overlap each other in the first direction (X-axis direction). For example, the cover member 1300 may include a first cover member group 1300a and a second cover member group 1300b. In addition, the first cover member group 1300a may include the first cover member 1300-1 to the sixth cover member 1300-6, and the second cover member group 1300b may include the seventh cover member 1300-7 to the 12th cover member 1300-12. In addition, the plurality of cover members 1300 may also be symmetrically disposed with respect to the fluid movement part 1100 like the thermoelectric module. In other words, the cover member 1300 may be disposed on the upper surface or lower surface of the fluid movement part 1100.

The guide part 1400 may be disposed between the first thermoelectric module group 1200a and the second thermoelectric module group 1200b. In other words, the guide part 1400 may be disposed between adjacent thermoelectric modules or adjacent thermoelectric module groups.

Furthermore, the guide part 1400 according to the embodiment may be disposed between adjacent cover members 1300 or between adjacent cover member groups. In addition, the guide part 1400 may be disposed between adjacent shield members 1600.

Specifically, at least a part of the guide part 1400 may be positioned between adjacent shield members 1600, and the other may be positioned under the shield member 1600. As described above, the guide part 1400 may be disposed at a boundary between the adjacent shield members 1600-1 and 1600-2 to seal the plurality of thermoelectric modules 1200 or thermoelectric module groups for each shield member. For example, the guide part 1400 may seal a space between the shield member 1600 and the fluid movement part 1100 to prevent moisture or contaminants from entering between the first shield member 1600-1 and the second shield member 1600-2 spaced apart from each other to reach the thermoelectric module under each shield member. Furthermore, the guide part 1400 may easily apply a second sealing member to be described below, thereby increasing the reliability of the thermoelectric device 1000 through sealing performed by the second sealing member.

The dummy module 1500 may be disposed on the upper surface and the lower surface of the fluid movement part 1100. In addition, the dummy module 1500 may be disposed at an end of the fluid movement part 1100 in the first direction (X-axis direction). For example, two dummy modules 1500 may be disposed to be spaced apart from each other in the first direction (X-axis direction) on the upper surface of the fluid movement part 1100, and the plurality of thermoelectric modules 1200 may be disposed between the two dummy modules 1500.

The dummy module 1500 may include grooves or holes capable of guiding electric wires connected to connectors to the outside.

In addition, at least a part of the dummy module 1500 may overlap the shield member 1600 in the third direction (Z-axis direction). For example, the second sealing member may be applied to the overlapping region, and the dummy module 1500 may be coupled to the shield member 1600 through the second sealing member. In the specification, the second sealing member includes a 2-1 sealing member and a 2-2 sealing member, and the 2-1 sealing member is a sealing member guided by the above-described guide part, and the 2-2 sealing member is a sealing member at least partially overlapping the dummy module 1500 in the vertical direction. However, in the specification, the second sealing member will be described, and a detailed description thereof will be described below.

Therefore, the first sealing member and the second sealing member may be disposed along an edge of the shield member 1600. In an embodiment, at least a part of the first sealing member may be connected to the second sealing member. For example, the first sealing member and the second sealing member may be in contact with each other at the edge of the shield member 1600 to form a closed loop. Therefore, as a length of the shield member 1600 increases in the first direction, since there is a limit in a process and a heat imbalance occurs due to an increase in bending caused by heat or pressurization, a plurality of shield members 1600 may be disposed side by side in the first direction. Therefore, since a separation space is inevitably formed between the adjacent shield members 1600 in the first direction in the process, the first sealing member may be in contact with the second sealing member at the edge of the shield member 1600, thereby protecting the thermoelectric module inside one shield member 1600. For example, the thermoelectric module 1200 under the shield member 1600 can be easily protected from moisture or contaminants.

The shield member 1600 may be disposed above or under the fluid movement part 1100. As described above, the shield member 1600 may be symmetrically disposed with respect to the fluid movement part 1100.

In addition, the plurality of shield members 1600 may be disposed to be spaced apart from each other in the first direction (X-axis direction) on the upper surface of the fluid movement part 1100. The separation space is present between the adjacent shield members 1600, for example, the first shield member 1600-1 and the second shield member 1600-2, and a part of the guide part 1400 may be disposed in the separation space.

In addition, the shield member 1600 may cover at least one thermoelectric module 1200 or thermoelectric module group. In this case, the shield member 1600 may include a shield hole corresponding to the heat sink of the thermoelectric module 1200. In other words, the heat sink may pass through the shield hole of the shield member 1600.

The shield member 1600 may be coupled to the fluid movement part 1100, the guide part 1400, and the dummy module 1500, and a lower portion of the shield member 1600, that is, the thermoelectric module can be protected by the first sealing member and the second sealing member. In addition, the shield member 1600 may be coupled to the second substrate of the thermoelectric element by a third sealing member, and the third sealing member can block contaminants or the like entering between the second substrate and the shield member 1600. A detailed description thereof will be given below.

The fixing member 1700 may be disposed on a surface facing the fluid movement part 1100 in the second direction (Y-axis direction). The fixing member 1700 may be provided as a plurality of fixing members 1700. The number of fixing members 1700 may be the same as the number of shield members 1600.

In addition, the fixing member 1700 includes a recess, and the fluid movement part 1100 and the shield member 1600 may be positioned in the recess. In other words, the fixing member 1700 can increase the coupling force between the fluid movement part 1100 and the shield member 1600. Furthermore, it is possible to primarily block external contaminants from moving to the shield member 1600 and the fluid movement part 1100. In addition, additionally, a bearing or sealing member may be further disposed in the recess. The fixing member 1700 may have, for example, a "⊂" shape.

The case 1800 may be disposed on the dummy module 1500 on the fluid movement part 1100 or disposed under the dummy module 1500 under the fluid movement part 1100 to surround the dummy module 1500. The case 1800 may surround the upper or lower dummy module 1500. In addition, at least a part of the case 1800 may overlap the shield member 1600 in the third direction (Z-axis direction). Therefore, the case 1800 may protect the dummy module 1500 and the shield member 1600.

Hereinafter, each component described above will be described in detail.

FIG. 3 is a perspective view of a fluid movement part of the power generation device according to the embodiment of the present invention, FIG. 4 is another perspective view of the fluid movement part of the power generation device according to the embodiment of the present invention, and FIG. 5 is a cross-sectional view of the power generation device along line A-A" in FIG. 1.

Referring to FIGS. 3 and 4, the fluid movement part 1100 according to the embodiment may include an upper surface 1110 and a lower surface 1120 opposite to each other in the vertical direction or the third direction (Z-axis direction).

According to the embodiment of the present invention, the plurality of thermoelectric modules 1200, the plurality of cover members, the plurality of guide parts, the plurality of dummy modules, the shield member, etc. may be disposed on one surface of the fluid movement part 1100. For example, the first substrate that is a lower substrate of the thermoelectric module 1200 may be disposed on the one surface (e.g., the upper surface or the lower surface) of the fluid movement part 1100. The first substrate may be disposed in indirect contact with the one surface of the fluid movement part 1100 through the TIM or the like.

In addition, the fluid movement part 1100 may include an inlet surface 1130 and an outlet surface 1140 opposite to each other in the first direction (X-axis direction). In addition, the fluid movement part 1100 may include a fluid hole 1100$h$ extending in the first direction (X-axis direction). The first fluid may be introduced into the inlet surface 1130 disposed at one side of the fluid hole 1100$h$, and the first fluid may be discharged to the outlet surface 1140 disposed at the other side of the fluid hole 1100$h$. Positions of the inlet surface 1130 and the outlet surface 1140 may also be interchanged.

In addition, the inlet flange JI may be disposed on the inlet surface 1130 as described above. In addition, the outlet flange (not shown) may be disposed on the outlet surface 1140. The inlet flange JI and the outlet flange may include a hole Jh. The holes Jh of the inlet flange JI and the outlet flange may extend in the first direction (X-axis direction). In addition, the inlet flange JI may be positioned to correspond to the fluid hole 1100$h$ of the fluid movement part 1100. For example, the holes Jh of the inlet flange JI and the outlet flange may be disposed to overlap the fluid hole 1100$h$ of the fluid movement part 1100 in the first direction (X-axis direction). Therefore, when the first fluid is introduced through the hole Jh of the inlet flange JI, the first fluid may pass through the hole Jh of the inlet flange JI and move to the fluid hole 1100$h$. In addition, the first fluid passing through the fluid hole 110$h$ may be discharged through the hole of the outlet flange. Areas of the holes Jh of the inlet flange JI and the outlet flange may be different from an area (e.g., a cross-sectional area (YZ plane) perpendicular to the first direction) of the fluid hole 1100$h$. For example, the areas of the holes Jh of the inlet flange JI and the outlet flange may be smaller than the area of the fluid hole 1100$h$. In addition, the number of holes Jh of the inlet flange JI and the outlet flange may be different from the number of fluid holes 1100$h$. However, this is illustrative, and the number, positions, shapes, etc. of holes of the fluid inlet and fluid outlet are not limited thereto. One fluid inlet, one fluid outlet, and a fluid passage pipe connecting the one fluid inlet and the one fluid outlet may also be formed in the fluid movement part 1100.

In addition, the fluid movement part 1100 may include a plurality of first fastening holes S1 and S2 extending in the vertical direction. The fluid movement part 1100 may couple the thermoelectric module and the dummy module through the plurality of first fastening holes S1 and S2. Therefore, the thermoelectric module disposed on the upper surface 1110 of the fluid movement part 1100 and the thermoelectric module disposed under the lower surface 1120 of the fluid movement part 1100 may be opposite to each other. Therefore, power generation by the temperature difference and power generation control can be easily performed.

Furthermore, the plurality of first fastening holes S1 and S2 may not overlap the fluid hole 1100$h$ in the vertical direction. Therefore, it is possible to easily prevent damage by the first fluid to screws or the like disposed in the first fastening holes S1 and S2 and increase the coupling force between the fluid movement part 1100 and the thermoelectric module or the dummy module.

In addition, the fluid movement part 1100 according to the embodiment may include a plurality of groove portions 1100$g$ disposed to be spaced apart from each other in the second direction (Y-axis direction) in the upper surface 1110 or the lower surface 1120. For example, groove portions 1100$g1$ (e.g., upper groove portions) disposed to be spaced apart from each other in the second direction (Y-axis direction) may be disposed in the upper surface 1110 of the fluid movement part 1100. In addition, groove portions 1100$g2$ (e.g., lower groove portions) disposed to be spaced apart from each other in the second direction (Y-axis direction) may be disposed on the lower surface 1120 of the fluid movement part 1100.

A plurality of groove portions 1100$g1$ may be formed in the upper portion of the fluid movement part 1100. For example, the groove portion 1100$g1$ may include a 1-1 groove 1100$g1a$ and a 1-2 groove 1100$g1b$ disposed to be spaced apart from each other in the second direction (Y-axis direction). A minimum separation distance between the 1-1 groove 1100$g1a$ and the thermoelectric module (e.g., the heat sink) in the second direction (Y-axis direction) may be different from a minimum separation distance between the 1-2 groove 1100$g1b$ and the thermoelectric module (e.g., the heat sink) in the second direction (Y-axis direction). For example, the minimum separation distance between the 1-1 groove 1100$g1a$ and the thermoelectric module (e.g., the heat sink) in the second direction (Y-axis direction) may be smaller than the minimum separation distance between the 1-2 groove 1100$g1b$ and the thermoelectric module (e.g., the heat sink) in the second direction (Y-axis direction). Therefore, it is possible to easily secure a space for arranging first and second connector parts and electric wires, which will be described below.

In addition, a plurality of groove portions 1100$g2$ may be formed in a lower portion of the fluid movement part 1100. For example, the groove portion 1100$g2$ may include a 2-1 groove 1100$g2a$ and a 2-2 groove 1100$g2b$ disposed to be spaced apart from each other in the second direction (Y-axis direction).

In addition, the first fastening holes S1 and S2 may be disposed between the groove portions 1100$g$ of the fluid movement part 1100 according to the embodiment. In other words, the thermoelectric module and the dummy module may be disposed between the groove portions 1100$g$ of the fluid movement part 1100 according to the embodiment. Positionally, the groove portion 1100$g$ of the fluid movement part 1100 may be disposed outside the thermoelectric module 1200. Therefore, as will be described below, the first sealing member may be applied to the groove portion 1100$g$ of the fluid movement part 1100 and bonded to the shield member, thereby easily protecting the thermoelectric module from contaminants introduced from the outside. In the specification, the term "inward" may be a direction from the outside of the fluid movement part 1100 toward the center of the fluid movement part 1100, and the term "outward" may be a direction from the center of the fluid movement part 1100 toward the outside of the fluid movement part 1100. The center of the fluid movement part 1100 may be a center of gravity or an intersection of lines bisecting each corner.

In addition, the fluid movement part 1100 may further include a plurality of second fastening holes S3 extending in the vertical direction. Through the second fastening hole S3, the fluid movement part 1100 may be coupled to the shield member and the fixing member by screw-coupling or the like.

Referring to FIG. 5, the shield member 1600 according to the embodiment may include a first part P1 vertically overlapping the thermoelectric module 1200, a second part P2 vertically misaligned with the thermoelectric module 1200, and a stepped part P3 for connecting the first part P1 and the second part P2 between the first part P1 and the second part P2.

The shield hole is disposed in the first part P1, and the heat sink 1220 may pass through the shield hole. A description thereof will be given below.

In addition, the thermoelectric element 1210 and the cover member 1300 may be positioned on a lower portion of the first part P1. The first part P1 may have an additional stepped region on the cover member 1300.

The second part P2 may be disposed to be misaligned with the thermoelectric module 1200 in the vertical direction and may be in contact with one surface (e.g., the upper surface) of the fluid movement part 1100. In other words, the second part P2 may be disposed closer to the one surface (e.g., the upper surface) of the fluid movement part 1100 than the first part P1 is. For example, a distance between the first part P1 and the upper surface of the fluid movement part 1100 in the vertical direction may be greater than a distance between the second part P2 and the upper surface of the fluid movement part 1100 in the vertical direction. In an embodiment, since a height of the fluid movement part 1100 in the vertical direction is smaller than a height of the thermoelectric module 1200 in the vertical direction, the thermoelectric module 1200 may be disposed inside the fluid movement part 1100 or in the groove. Therefore, the first part P1 may have a height from the one surface (e.g., the upper surface) of the fluid movement part 1100 smaller than a height from the one surface (e.g., the upper surface) of the fluid movement part 1100 of the second part P2, thereby easily securing the space of the thermoelectric module.

The stepped part P3 may be disposed between the first part P1 and the second part P2. The stepped part P3 may be in contact with the first part P1 and the second part P2. In addition, the stepped part P3 may be inclined at predetermined angles θ1 and θ2 with respect to the second part P2. In addition, the predetermined angles θ1 and θ2 may be different from each other. For example, the angle (θ2, for example, a second angle) between the second part P2 closer to the cover member 1300 and the stepped part P3 may be different from the angle (θ1, for example, a first angle) between the second part P2 spaced apart from the cover member 1300 and the stepped part P3. The first angle θ1 may be smaller than the second angle θ2. Therefore, it is possible to easily secure a space in which the cover member 1300 may be disposed in the lower portion of the first part P1. With this configuration, it is possible to increase resistance of the shield member 1300 against the fluid. Therefore, it is possible to reduce the movement of the fluid on the shield member 1300, thereby increasing heat exchange between the fluid and the heat sink of the thermoelectric module passing through the shield member 1300. Therefore, it is possible to increase energy efficiency of the thermoelectric device according to the embodiment.

In addition, the second part P2 may be positioned outside the thermoelectric module 1200 or the first part P1. For example, the second part P2, the stepped part P3, the first part P1, the stepped part P3, and the second part P2 may be sequentially disposed from the shield member 1600 in the second direction (Y-axis direction).

In addition, the groove portion 1100g according to the embodiment may overlap at least a part of the shield member 1600 in the vertical direction (Z-axis direction). For example, the upper groove portion 1100g1 and the lower groove portion 1100g2 may overlap at least one of the second part P2 and the stepped part P3 in the vertical direction (Z-axis direction). In an embodiment, the groove portion 1100g of the fluid movement part 1100 may be positioned in a lower portion of a boundary between the second part P2 and the stepped part P3. The boundary may be disposed outside the thermoelectric module 1200. Therefore, when a first sealing member SL1 is applied to the groove portion 1100g, the first sealing member SL1 may be in contact with both the second part P2 and the stepped part P3 to easily remove an empty space between the second part P2 and the fluid movement part 1100. For example, the first sealing member LS1 may be in contact with both the second part P2 and the stepped part P3, and the second part P2 may press the first sealing member SL1 from the outside so that an inside of the first sealing member SL1 may be convex upward. Therefore, the first sealing member SL1 may be entirely in contact with a bottom surface of the stepped part P3 and may easily extend upward along the bottom surface. Therefore, it is possible to increase the coupling force between the shield member 1600 and the fluid movement part 1100 by the first sealing member SL1. In addition, contaminants and moisture that may permeate between the shield member 1600 and the fluid movement part 1100, particularly, between the second part P2 and the fluid movement part 1100, can be blocked by the first sealing member SL1. Furthermore, it is possible to suppress the first sealing member SL1 from overflowing into the thermoelectric module.

FIGS. 6 and 7 are views showing a thermoelectric element according to one embodiment of the present invention.

Referring to FIGS. 6 and 7, a thermoelectric element 100 includes a first substrate 110, a first electrode 120, a P-type thermoelectric leg 130, an N-type thermoelectric leg 140, a second electrode 150, and a second substrate 160.

The first electrode 120 is disposed between the first substrate 110 and lower surfaces of the P-type thermoelectric leg 130 and the N-type thermoelectric leg 140, and the second electrode 150 is disposed on the second substrate 160 and upper surfaces of the P-type thermoelectric leg 130 and the N-type thermoelectric leg 140. Therefore, a plurality of P-type thermoelectric legs 130 and a plurality of N-type thermoelectric legs 140 are electrically connected by the first electrode 120 and the second electrode 150. A pair of P-type thermoelectric legs 130 and N-type thermoelectric legs 140 disposed between the first electrode 120 and the second electrode 150 and electrically connected to each other may form a unit cell.

For example, when a voltage is applied to the first electrode 120 and the second electrode 150 through lead wires 181 and 182, due to the Peltier effect, a substrate in which a current flows from the P-type thermoelectric leg 130 to the N-type thermoelectric leg 140 may absorb heat to serve as a cooling part, and a substrate in which a current flows from the N-type thermoelectric leg 140 to the P-type thermoelectric leg 130 may be heated to serve as a heating part. Alternatively, when a temperature difference between the first electrode 120 and the second electrode 150 is applied, charges in the P-type thermoelectric leg 130 and the N-type thermoelectric leg 140 may move to generate electricity due to the Seebeck effect.

Here, the P-type thermoelectric leg 130 and the N-type thermoelectric leg 140 may be bismuth telluride (Bi—Te)-based thermoelectric legs containing bismuth (Bi) and tellurium (Te) as main materials. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain Bi—Sb—Te at 99 to 99.999 wt %, which is the main raw material, with respect to 100 wt % of the total weight and contain at least one of nickel (Ni), aluminum (Al), copper (Cu), silver (Ag), lead (Pb), boron (B), gallium (Ga), and indium (In) at 0.001 to 1 wt %. The N-type thermoelectric leg 140 may be a bismuth telluride (Bi—Te)-based thermoelectric leg containing at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain Bi—Se—Te at 99 to 99.999 wt %, which is the main raw material, with respect to 100 wt % of the total weight and contain at least one of nickel (Ni), aluminum (Al), copper (Cu), silver (Ag), lead (Pb), boron (B), gallium (Ga), and indium (In) at 0.001 to 1 wt %.

The P-type thermoelectric leg 130 and the N-type thermoelectric leg 140 may be formed in a bulk type or a stacked type. In general, the bulk type P-type thermoelectric leg 130 or the bulk type N-type thermoelectric leg 140 may be obtained by performing a thermal process on a thermoelectric material to manufacture an ingot, crushing and sieving the ingot to acquire a powder for thermoelectric leg, then sintering the powder, and cutting a sintered material. In this case, the P-type thermoelectric leg 130 and the N-type thermoelectric leg 140 may be polycrystalline thermoelectric legs. As described above, when the P-type thermoelectric leg 130 and the N-type thermoelectric leg 140 are the polycrystalline thermoelectric legs, strengths of the P-type thermoelectric leg 130 and the N-type thermoelectric leg 140 may be increased. The stacked P-type thermoelectric leg 130 or the stacked N-type thermoelectric leg 140 may be obtained through a process of applying a paste including a thermoelectric material onto a base having a sheet shape to form a unit member, and then stacking and cutting the unit member.

In this case, the pair of P-type thermoelectric legs 130 and N-type thermoelectric legs 140 may have the same shape and volume or different shapes and volumes. For example, since electrical conduction characteristics of the P-type thermoelectric leg 130 and the N-type thermoelectric leg 140 are different, a height or a cross-sectional area of the N-type thermoelectric leg 140 may also be formed differently from a height or a cross-sectional area of the P-type thermoelectric leg 130.

In this case, the P-type thermoelectric leg 130 or the N-type thermoelectric leg 140 may have a cylindrical shape, a polygonal column shape, an elliptical column shape, etc.

In the specification, the thermoelectric leg may also be referred to as a thermoelectric structure, a semiconductor element, a semiconductor structure, etc.

The performance of the thermoelectric element according to one embodiment of the present invention may be expressed by a figure of merit (ZT). The ZT may be expressed as in Equation 1.

$$ZT = \alpha^2 \cdot \sigma \cdot T / k \quad \text{[Equation 1]}$$

Here, α denotes a Seebeck coefficient [V/K], σ denotes electrical conductivity [S/m], and α2σ denotes a power factor ([W/mK2]). In addition, T denotes a temperature, and k denotes thermal conductivity [W/mK]. k may be expressed as a·cp·ρ in which a denotes thermal diffusivity [cm2/S], cp denotes specific heat [J/gK], and ρ denotes a density [g/cm3].

In order to obtain the ZT of the thermoelectric element, a Z value (V/K) may be measured using a Z meter, and the ZT may be calculated using the measured Z value.

Here, the first electrode 120 disposed between the first substrate 110 and the P-type thermoelectric leg 130 and the N-type thermoelectric leg 140, and the second electrode 150 disposed between the second substrate 160 and the P-type thermoelectric leg 130 and the N-type thermoelectric legs 140 may contain at least one of copper (Cu), silver (Ag), aluminum (Al), and nickel (Ni) and have a thickness of 0.01 mm to 0.3 mm. When the thickness of the first electrode 120 or the second electrode 150 is less than 0.01 mm, a function for an electrode may be degraded, thereby reducing electrical conduction performance, and when the thickness exceeds 0.3 mm, conduction efficiency may be reduced due to an increase in resistance.

In addition, the first substrate 110 and the second substrate 160 opposite to each other may be metal substrates and may have a thickness of 0.1 mm to 1.5 mm. When the thickness of the metal substrate is less than 0.1 mm or exceeds 1.5 mm, heat-dissipation characteristics or thermal conductivity may be excessively high, thereby reducing the reliability of the thermoelectric element. In addition, when the first substrate 110 and the second substrate 160 are metal substrates, an insulating layer 170 may be further formed between the first substrate 110 and the first electrode 120 and between the second substrate 160 and the second electrode 150. The insulating layer 170 may include a material having a thermal conductivity of 1 to 20 W/mK. In this case, the insulating layer 170 may be a resin composition containing at least one of an epoxy resin and a silicone resin and an inorganic material, a layer made of a silicon composite containing silicon and an inorganic material, or an aluminum oxide layer. Here, the inorganic material may be at least one of oxides, nitrides, and carbides combined with aluminum, boron, and silicon.

In this case, the first substrate 110 and the second substrate 160 may be formed to have different sizes. In other words, a volume, a thickness or an area of one of the first substrate 110 and the second substrate 160 may be formed to be greater than that of the other. Here, the thickness may be a thickness in a direction from the first substrate 110 toward the second substrate 160, and the area may be an area in a direction perpendicular to the direction from the first substrate 110 to the second substrate 160. Therefore, it is possible to increase the heat-absorption performance or heat-dissipation performance of the thermoelectric element. Preferably, the volume, the thickness, or the area of the first substrate 110 may be formed to be greater than at least one of the volume, the thickness, and the area of the second substrate 160. In this case, when the first substrate 110 is disposed in a high-temperature region for the Seebeck effect, at least one of the volume, the thickness, and the area of the first substrate 110 may be formed to be greater than that of the second substrate 160 when the first substrate 110 is applied to the heating region for the Peltier effect or when a sealing agent for protecting the thermoelectric element to be described below from external environments or the like is disposed on the first substrate 110. In this case, the area of the first substrate 110 may be formed in a range of 1.2 to 5 times the area of the second substrate 160. When the area of the first substrate 110 is formed to be less than 1.2 times the area of the second substrate 160, the influence on the improvement of heat transfer efficiency is not high, and when the area of the first substrate 110 exceeds 5 times, the heat transfer efficiency may be rather significantly reduced, and it may be difficult to maintain a basic shape of the thermoelectric module.

In addition, a heat-dissipation pattern, for example, an uneven pattern may be formed on a surface of at least one of the first substrate 110 and the second substrate 160. Therefore, it is possible to increase the heat-dissipation performance of the thermoelectric element. When the uneven pattern is formed on a surface in contact with the P-type thermoelectric leg 130 or the N-type thermoelectric leg 140, it is also possible to increase bonding characteristics between the thermoelectric leg and the substrate.

Although not shown, a sealing member may be further disposed between the first substrate 110 and the second substrate 160. The sealing member may be disposed on side surfaces of the first electrode 120, the P-type thermoelectric leg 130, the N-type thermoelectric leg 140, and the second electrode 150 between the first substrate 110 and the second substrate 160. Therefore, the first electrode 120, the P-type thermoelectric leg 130, the N-type thermoelectric leg 140, and the second electrode 150 may be sealed from external moisture, heat, contamination, etc.

Description of the thermoelectric element 100 according to the above-described embodiment may be applied to components of a thermoelectric module or a thermoelectric element of the thermoelectric device according to the embodiment of the present invention. Hereinafter, a description thereof will be given below.

FIG. 8 is a perspective view of a thermoelectric module included in the power generation device according to the embodiment of the present invention, FIG. 9 is a top view of a first board of the thermoelectric module included in the power generation device according to the embodiment of the present invention, and FIG. 10 is a top view in which a plurality of thermoelectric modules are disposed on one surface of the fluid movement part included in the power generation device according to the embodiment of the present invention.

Referring to FIGS. 8 to 10, the thermoelectric module 1200 may include the thermoelectric element 1210 and the heat sink 1220 disposed on the thermoelectric element 1210.

The contents described with reference to FIGS. 6 and 7 may be applied to the thermoelectric element 1210 in the same manner. For example, the thermoelectric element 1210 may include a first substrate 1212 in contact with the one surface (upper surface or lower surface) of the fluid movement part 1100, a second substrate 1214 (e.g., an upper substrate) spaced apart from the first substrate 1212 in the vertical direction, a plurality of first electrodes disposed between the first substrate 1212 and the second substrate 1214, a plurality of thermoelectric legs, and a plurality of second electrodes. In this case, since the first substrate 1212, the plurality of first electrodes, the plurality of thermoelectric legs, the plurality of second electrodes, and the second substrate 1214 respectively correspond to the plurality of first electrodes 120, the plurality of thermoelectric legs 130 and 140, the plurality of second electrodes 150, and the second substrate 160 described with reference to FIGS. 6 and 7, the above-described contents may be applied thereto.

In the thermoelectric element 1210 according to the embodiment, the first substrate 1212 may include a first region A1 and a second region A2. In this case, the plurality of first electrodes, the plurality of thermoelectric legs, the plurality of second electrodes, the second substrate, and the heat sink 1220 may be disposed in the first region A1. In addition, the second region A2 may be positioned at one side of the first region A1, and first and second connectors 210 and 220 connected to the first electrode may be disposed in the second region A2. A plurality of first and second connectors 210 and 220 may be formed to facilitate connection with electric wires and easily change an electrical connection method such as connection in series or in parallel.

In addition, according to the embodiment of the present invention, the fluid movement part 1100 and the thermoelectric module 1200 may be coupled by a fastening member such as a screw. To this end, as described above, the first fastening holes may be formed in the upper surface 1110 of the fluid movement part 1100, and a plurality of first through holes 1200$h$1 may also be formed in the first region A1 of the first substrate 1212 in the thermoelectric module 1200. The plurality of first fastening holes and the plurality of first through holes 1200$h$1 may be positioned to correspond to each other. For example, the plurality of first fastening holes and the plurality of first through holes 1200$h$1 may overlap each other in the vertical direction.

In addition, the first through hole 1200$h$1 may be formed not only in the first substrate 1212 but also in the second substrate (not shown) and the heat sink 1220 of the thermoelectric module 1200. The thermoelectric module 1200 and the fluid movement part 1100 may be fastened by screws or the like through the first through hole 1200$h$1.

Meanwhile, according to the embodiment of the present invention, a plurality of second through holes 1200$h$2 may be further formed in the upper surface 1110 of the fluid movement part 1100. The second through hole 1200$h$2 may be positioned in the second region A2 of the first substrate 1212. The second through hole 1200$h$2 may be positioned to correspond to the above-described second fastening hole. For example, the second through hole 1200$h$2 may overlap the second fastening hole in the vertical direction.

In addition, as described above, since the cover member 1300 is disposed in the second region A2 of the first substrate 1212, the cover member 1300, the thermoelectric module 1200, and the fluid movement part 1100 may be coupled by a fastening member (e.g., a screw) through the second through hole 1200$h$2.

With this configuration, since not only the first region A1 but also the second region A2 of the first substrate 1212 of the thermoelectric module 1200 may be coupled to the fluid movement part 1100, the fluid movement part 1100 may have an uniform bonding force with the entire first substrate 1212 of the thermoelectric module 1200, and heat may be uniformly distributed to the entire first substrate 1212.

FIG. 11 is a perspective view of a cover member included in the power generation device according to the embodiment of the present invention, FIG. 12 is a view showing the power generation device according to the embodiment of the present invention and a cover member coupled to the power generation device, and FIG. 13 is a cross-sectional view of the power generation device along line B-B" in FIG. 12.

Referring to FIGS. 11 to 13, the cover member 1300 according to the embodiment may be disposed to overlap the second region A2 of the first substrate 1212 in the vertical direction in the thermoelectric module 1200. In other words, the cover member 1300 may be disposed on the second region A2 of the thermoelectric module 1200 to surround the first and second connectors 210 and 220 disposed in the second region A2 and surround electric wires (not shown) electrically connected to the first and second connectors 210 and 220.

In addition, the cover member 1300 may be coupled to the thermoelectric module 1200 and the fluid movement part 1100 through the first fastening hole. Due to this coupling, it is possible to increase a fastening torque. Therefore, the thermoelectric module 1200 may be more firmly attached to the fluid movement part 1100 even under vibration conditions.

In this case, a length of the cover member 1300 in the first direction (X-axis direction) may be the same as a length of the first substrate 1212 in the first direction (X-axis direction). For example, the length of the cover member 1300 in the first direction (X-axis direction) may be in a range of 0.9 to 1 times, preferably, 0.925 to 1 times, and more preferably, 0.95 to 1 times the length of the first substrate 1212 on which the cover member 1300 is disposed in the first direction (X-axis direction). With this configuration, since the cover member 1300 presses the entire length of the first substrate 1212 in the first direction, it is possible to prevent deformation or separation of the first substrate 1212.

In addition, the cover member 1300 may include an upper surface groove 1310g disposed in an upper surface 1310. A sealing agent may be applied to the upper surface groove 1310g. Therefore, the upper surface 1310 of the cover member 1300 and the shield member 1600 on the cover member 1300 may be bonded and sealed. Therefore, it is possible to block foreign substances, moisture, etc. from entering between the shield member 1600 and the cover member 1300. Therefore, it is possible to increase electrical stability of the thermoelectric module 1200 and the like.

In addition, the cover member 1300 may include a plurality of cover holes 1300h. The cover hole 1300h may be positioned to correspond to the above-described second through hole of the thermoelectric module. In other words, the cover hole 1300h may overlap the second through hole in the vertical direction. In addition, the second through hole may be positioned to correspond to the first fastening hole of the fluid movement part. Therefore, the first fastening hole, the second through hole, and the cover hole 1300h may overlap in the vertical direction, and thus the fluid movement part 1100, the thermoelectric module 1200, and the cover member 1300 may be coupled by the fastening member.

In addition, since the cover holes 1300h are formed in both sides of the cover member 1300, both sides of the second region A2 of the first substrate 121 are supported in a balanced manner and thermal deformation of the first substrate 1212 can be prevented. In this case, a distance between two cover holes 1300h in one cover member 1300 may be greater than a distance between two first through holes in the thermoelectric module 1200. With this configuration, the cover member 1300 can uniformly support both sides of the second region A2 of the first substrate 1212 in a balanced manner.

In addition, a first cover groove 1300g1 and a second cover groove 1300g2 may be disposed in a lower surface 1320 of the cover member 1300. The second cover groove 1300g2 may be positioned in the first cover groove 1300g1 to overlap the first cover groove 1300g1 in the vertical direction.

The first cover groove 1300g1 may extend in the first direction (X-axis direction) and may be disposed to be spaced apart from the cover hole 1310h of the first substrate 1212 in the second direction (Y-axis direction). Conductive wires and the first and second connectors 210 and 220 may be positioned in the first cover groove 1300g1. In addition, the conductive wires may be disposed along the first cover grooves 1300g1 of the plurality of adjacent cover members 1300 to electrically connect the adjacent thermoelectric modules 1200.

In an embodiment, the first cover groove 1300g1 may overlap the second region A2 of the first substrate 1212 in the vertical direction and, in particular, may overlap the first and second connectors 210 and 220 in the vertical direction. In particular, the second cover groove 1300g2 may be positioned to correspond to the first and second connectors 210 and 220. For example, the second cover groove 1300g2 may overlap the first and second connectors 210 and 22 in the vertical direction.

Furthermore, a gap region GP may be formed between the first and second connectors 210 and 220 and a bottom surface of the second cover groove 1300g2 by the second cover groove 1300g2. Therefore, it is possible to increase compatibility for a size while protecting the first and second connectors 210 and 220.

In addition, the cover member 1300 may include a plurality of third cover grooves 1300g3 disposed between the separated cover holes 1300h. Heights (lengths in the vertical direction) of the plurality of third cover grooves 1300g3 may be different from heights of the first cover grooves 1300g1 and the second cover grooves 1300g2. For example, the heights (length in the vertical direction) of the plurality of third cover grooves 1300g3 may be smaller than the heights of the first cover groove 1300g1 and the second cover groove 1300g2.

In addition, a bonding member for facilitating fastening between the first substrate 1212 and the cover member 1300 may be applied to the third cover groove 1300g3. Therefore, it is possible to increase a bonding force between the cover member 1300 and the thermoelectric module 1200, particularly, the first substrate 1212.

In addition, since the cover member 1300 is disposed in the second region A2 on the first substrate 1212 and coupled to the fluid movement part 1100 through the cover hole 1300h as described above, it is possible to suppress a lifting phenomenon between the fluid movement part 1100 and the first substrate 1212 in the second region A2.

In addition, the cover member 1300 according to the embodiment may include an insulating material, for example, a plastic material. Therefore, since a head of the fastening member is in contact with the cover member 1300, the first substrate 1212 and the head of the fastening member including a metal may be insulated, and it is possible to increase the withstand voltage performance of the thermoelectric module 1200.

In addition, when the cover member 1300 includes the plastic material, the cover member 1300 may be easily molded with any of various sizes and shapes. More specifically, the cover member 1300 may be a plastic material applicable at high temperature, such as polyphenylene sulfide (PPS). Therefore, it is possible to prevent a problem that the shape of the cover member 1300 is deformed by the high-temperature second fluid.

In addition, the first part P1 of the shield member 1600 may include a 1-1 part P1-1 and a 1-2 part P1-2. The 1-1 part P1-1 may overlap the first region of the thermoelectric module 1200 in the vertical direction. In addition, the 1-2 part P1-2 may overlap the second region A2 of the thermoelectric module 1200 in the vertical direction. The above-described cover member and first and second connectors may be disposed on a lower portion of the 1-2 part P1-2. In addition, in the 1-1 part P1-1, a height hb from the upper surface 1110 of the fluid movement part 1100 in the vertical direction may be smaller than a height ha between the 1-2 part P1-2 and the upper surface 1110 of the fluid movement part 1100 in the vertical direction. With this configuration, as described above, an inclination angle of the stepped part of the shield member may increase through a height difference of the first part. Therefore, a thermal resistance to the fluid by the 1-2 part P1-2 increases, and thus the fluid may remain on the first part P1 for a longer time. Therefore, it is possible to increase the thermal efficiency of the thermoelectric device according to the embodiment. Furthermore, it is possible to easily secure spaces for the first and second connectors 210 and 220 and electric wires.

FIGS. 14 and 15 are perspective views of a guide part included in the power generating device according to the embodiment of the present invention, FIG. 16 is a view of the guide part along line C-C' in FIG. 14, and FIG. 17 is a cross-sectional view of the guide part along line D-D' in FIG. 14.

Referring to FIGS. 14 to 17, in the thermoelectric device according to the embodiment, the guide part 1400 may be disposed between adjacent shield members. Therefore, at least a part of the guide part 1400 may overlap the shield member in the vertical direction. In addition, the guide part 1400 may be disposed between adjacent thermoelectric module groups. For example, the guide part 1400 may be disposed to be spaced apart from the adjacent thermoelectric module groups in the first direction (X-axis direction).

More specifically, the guide part 1400 may include a central portion 1410 and a support portion 1420 in contact with the central portion 1410 and disposed to be spaced apart from the central portion 1410 in the first direction (X-axis direction). The support portion 1420 may be in contact with the central portion 1410 and may extend from a side surface of the central portion 1410 in the first direction (X-axis direction) or in the direction opposite to the first direction (X-axis direction).

The central portion 1410 may be positioned on a bisector in the first direction (X-axis direction) of the guide part 1400. The central portion 1410 may be disposed at the center of the guide part 1400, and two separated support portions 1420 may be symmetrically disposed with respect to the central portion 1410. For example, the central portion 1410 may be disposed between adjacent shield members. Therefore, in the guide part 1400, a support force for the shield member disposed on the support portion 1420 may be applied thereto in a balanced manner without being concentrated on one side with respect to the central portion 1410. Therefore, it is possible to increase the reliability of the guide part 1400.

In addition, the central portion 1410 may have a length La in the second direction (Y-axis direction) that is greater than a length between the groove portions disposed to be spaced apart from each other in the upper surface of the fluid movement part in the second direction (Y-axis direction). Therefore, at least a part of the central portion 1410 may overlap the groove portion of the fluid movement part in the vertical direction.

In addition, the support portion 1420 may be in contact with the side surface of the central portion 1410. A height H1 of the central portion 1410 in the vertical direction may be different from a height H2 of the support portion 1420 in the vertical direction. The height H1 of the central portion 1410 in the vertical direction may be greater than the height H2 of the support portion 1420 in the vertical direction.

In addition, the length La of the support portion 1420 in the second direction (Y-axis direction) may be different from a length Lb of the central portion 1410 in the second direction (Y-axis direction). The length La of the support portion 1420 in the second direction (Y-axis direction) may be smaller than the length Lb of the central portion 1410 in the second direction (Y-axis direction).

Therefore, the central portion 1410 may have a structure protruding in the second direction (Y-axis direction) and in the vertical direction as compared to the support portion 1420. Therefore, as will be described below, when the second sealing member is applied on the support portion and the shield member and the guide part are sealed by the second sealing member, it is possible to prevent the overflowing of the second sealing member to the separated support portions 1420. Furthermore, the central portion 1410 may guide the position of the second sealing member so that the second sealing member passes the support portion 1420 and faces the groove portion of the adjacent fluid movement part. Therefore, the first sealing member and the second sealing member on the groove portion of the fluid movement part may be in contact with each other to perform external sealing of the entirety of the plurality of thermoelectric modules disposed under one shield member. Therefore, it is possible to increase the reliability of the plurality of thermoelectric modules.

In addition, the height H2 of the support portion 1420 in the vertical direction may correspond to a height of the thermoelectric element. For example, the height H2 of the support portion 1420 in the vertical direction may be the same as the height of the thermoelectric element. Therefore, since the shield member does not have a step difference from the surface in contact with the guide part 1400 and the thermoelectric element, it is possible to provide process easiness and solve the difficulty of the sealing due to the step difference.

In addition, at least a part of the support portion 1420 may be disposed under the shield member, and an upper surface of the support portion 1420 may face the shield member.

The guide part 1400 may include a plurality of guide holes. For example, the support portion 1420 of the guide part 1400 may include a first guide hole 1420h1 and a second guide hole 1420h2. A plurality of first guide holes 1420h1 and second guide holes 1420h2 may be formed and symmetrically disposed with respect to the central portion 1410. Therefore, when the guide part 1400 is coupled to the fluid movement part, a force due to the fastening may be uniformly applied to the guide part 1400 and the fluid movement part. Therefore, it is possible to easily prevent a phenomenon in which the guide part is lifted from the upper surface of the fluid movement part.

In addition, in an embodiment, the guide part 1400 may include a first guide region SA1 disposed at one side and a second guide region SA2 disposed at the other side. The first guide region SA1 may correspond to the first region in the thermoelectric module. For example, the first guide region SA1 may overlap the first region of the adjacent thermoelectric module in the first direction (X-axis direction). In addition, the second guide region SA2 may be disposed at a side opposite to the second direction (Y-axis direction) from the first guide region SA1. The second guide region SA2 may overlap the second region of the adjacent thermoelectric module in the first direction (X-axis direction).

The above-described first guide hole 1420h1 may be disposed in the first guide region SA1. For example, the first guide hole 1420*h*1 may be positioned to correspond to the first through hole of the first region. In other words, the first guide hole 1420*h*1 may overlap the first through hole in the first direction (X-axis direction). Therefore, it is possible to easily manufacture the fluid hole of the fluid movement part by the first guide hole 1420*h*1.

In addition, the second guide hole 1420*h*2 may be disposed in the second guide region SA2. For example, the second guide hole 1420*h*2 may be positioned to correspond to the second through hole and may overlap the second through hole in the first direction (X-axis direction). Therefore, the fastening between the guide part 1400 and the fluid movement part may be made corresponding to the fastening between the thermoelectric module and the fluid movement part. Therefore, it is possible to easily form the above-described fastening holes and through holes and easily manufacture the fluid holes in the fluid movement part, and the first fluid may be easily moved in the first direction (X-axis direction).

In addition, the guide part 1400 according to the embodiment may include a guide groove 1400*g* formed in a bottom surface. The guide groove 1400*g* may be positioned in the second guide region SA2. The guide groove 1400*g* may be positioned to correspond to the above-described first cover groove. For example, the guide groove 1400*g* may overlap the first cover groove in the first direction (X-axis direction). With this configuration, the electric wires connected to the first and second connectors in the first cover groove may pass through the guide groove 1400*g* to electrically connect the thermoelectric modules disposed under the adjacent shield members. The guide groove 1400*g* may have the same height in the vertical direction as the height of the first cover groove in the vertical direction. Therefore, it is possible to prevent the bending of the electric wire or the like.

In addition, the support portion 1420 may have a stepped region corresponding to the cover member 1300. In other words, a height of the support portion 1420 in the vertical direction in the first guide region SA1 may be smaller than a height of the support portion 1420 in the vertical direction in the second guide region SA2. Since the height of the cover member 1300 is greater than the height of the thermoelectric element, the support portion 1420 also has the above-described height difference. Therefore, the support portion 1420 may have a stepped structure on a portion adjacent to the second region.

In addition, the guide part 1400 according to the embodiment may include groove portions 1420*g* disposed in an upper surface 1400*a*. The groove portion 1420*g* of the guide part 1400 may be disposed in the support portion 1420. Therefore, the groove portion 1420*g* of the guide part 1400 may overlap each of the separated shield members in the vertical direction.

The groove portions 1420*g* of the guide part 1400 may be disposed in the upper surface of the support portion 1420 and symmetrically disposed with respect to the central portion 1410. For example, two groove portions 1420*g* of the guide part 1400 may be formed. However, the present invention is not limited to the number.

In addition, the groove portion 1420*g* of the guide part 1400 may be disposed closer to the central portion 1410 than an outer surface of the guide part 1400. For example, a distance d1 between the groove portion 1420*g* of the guide part 1400 and the outer surface of the guide part 1400 may be different from a distance d2 between the groove portion 1420*g* and the central portion 1410 of the guide part 1400. The distance d1 between the groove portion 1420*g* of the guide part 1400 and the outer surface of the guide part 1400 may be greater than the distance d2 between the groove portion 1420*g* and the central portion 1410 of the guide part 1400. With this configuration, the second sealing member applied to the groove portion 1420*g* of the guide part 1400 may easily move toward the central portion 1410 when the shield member is seated on the guide part 1400. Therefore, the second sealing member may be disposed between the bottom surface of the shield member and the upper surface 1400*a* of the guide part 1400 and between the side surface of the shield member and a side surface 1410*a* of the central portion 1410. Therefore, the guide part 1400 and the shield member may be tightly sealed by the second sealing member without an empty region. A detailed description thereof will be given below.

FIGS. 18 and 19 are views for describing a shield member being coupled in the power generation device according to the embodiment of the present invention, FIG. 20 is a cross-sectional view of the shield member being coupled along line E-E" in FIG. 19, FIG. 21 is an enlarged view of portion K1 in FIG. 19, FIG. 22 is a cross-sectional view of portion K1 along line F-F" in FIG. 21, FIG. 23 is an enlarged view of portion K2 in FIG. 19, and FIG. 24 is a cross-sectional view of portion K2 along line G-G' in FIG. 23.

Referring to FIGS. 18 and 19, after the plurality of thermoelectric modules 1200, the plurality of cover members 1300, the guide part 1400, and the dummy module (not shown) are disposed on the fluid movement part, the shield member is seated thereon, and thus the thermoelectric module 1200 can be protected by the shield member 1600 from external moisture and contaminants. In this case, for more tight sealing, after the first sealing member SL1 is applied into the groove portion of the fluid movement part and the second sealing member SL2 is applied into the groove portion of the guide part 1400, the shield member 1600 may be seated thereon. Therefore, the first sealing member and the second sealing member SL2 may be disposed in a space between the shield member 1600 and the fluid movement part and a space between the guide part 1400 and the shield member, thereby implementing sealing. It should be understood that some of the shown fastening members (e.g., screws) may be identically disposed in the holes of each component in the drawings. In addition, as described above, the guide part 1400 may be disposed between the plurality of adjacent shield members 1600-1 and 1600-2 or between the plurality of adjacent thermoelectric module groups.

In addition, the second sealing member SL2 may be applied into the groove portion of the guide part 1400 and moved to the upper surface and side surfaces of the support portion and the side surfaces of the central portion by the shield member 1600. A detailed description thereof will be given below.

Referring to FIG. 20, the guide part 1400 may be disposed between one shield member 1600-1 and another shield member 1600-2 adjacent thereto. In addition, at least a partial region of the support portion 1420 may overlap the shield member 1600 in the vertical direction. The central portion 1410 may be misaligned with the shield member 1600 in the vertical direction and disposed to be spaced apart from the shield member 1600 in the first direction (X-axis direction).

The second sealing member SL2 may be disposed in the groove portion 1420*g* of the guide part 1400 and an upper surface 1420*a* of the support portion 1420. The upper surface 1420*a* of the support portion 1420 may face the shield member 1600 disposed on the support portion 1420. Furthermore, the second sealing member SL2 may also be disposed on the side surface 1410*a* of the central portion

1410. The side surface 1410*a* of the central portion 1410 may be a surface in contact with the upper surface 1420*a* of the support portion 1420. Therefore, the second sealing member SL2 may be disposed between the bottom surface of the shield member 1600 and the upper surface 1420*a* of the support portion 1420 and between the side surface of the shield member 1600 and the side surface 1410*a* of the central portion 1410. Therefore, it is possible to suppress moisture or contaminants from entering from the outside of the shield member 1600 to a region between the guide part 1400 and the shield member 1600.

In addition, in the specification, the sealing member (e.g., the first to third sealing members) to be described below may be made of a heat-resistant and moisture-resistant material. For example, the sealing member may include a sealing material, a sealing tape, etc. containing heat-resistant silicone.

Referring to FIGS. 21 to 24, as described above, the second sealing member SL2 may be disposed on the upper surface and side surfaces of the guide part 1400. For example, the second sealing member SL2 may also be disposed on the side surface 1420*b* of the support portion 1420 to be in contact with the side surface 1420*b* of the support portion 1420.

In addition, the side surface 1420*b* of the support portion 1420 may be disposed adjacent to the groove portion 1100*g* of the fluid movement part 1100. Therefore, the first sealing member SL1 on the groove portion 1100*g* of the fluid movement part 1100 and the second sealing member SL2 disposed on the side surface 1420*b* of the support portion 1420 may be in contact with each other. In other words, the second sealing member SL2 and the first sealing member SL1 may be connected by the guide part 1400. Therefore, contaminants or the like can be blocked from entering between the plurality of adjacent shield members 1600-1 and 1600-2 by the first sealing member SL1 and the second sealing member SL2.

The groove portion 1100*g* of the fluid movement part 1100 and the side surface 1420*a* of the support portion 1420 in the guide part 1400 may be spaced apart from each other in the second direction (Y-axis direction). In addition, at least a part of the central portion may overlap the groove portion 1100*g* of the fluid movement part 1100 in the vertical direction. Therefore, the central portion 1410 may guide the second sealing member SL2 to move toward the groove portion 1100*g* of the fluid movement part 1100 along the side surface 1410*a* of the central portion 1410. Therefore, the central portion 1410 may guide the second sealing member SL2 to bring into contact with the first sealing member SL1 so as to remove an empty region between the shield member 1600, the fluid movement part 1100, and the guide part 1400, thereby performing tight sealing.

In addition, since the support portion 1420 has the stepped region corresponding to the cover member 1300 as described above, a height H3 of the support portion 1420 in the vertical direction in the first guide region may be smaller than a height H4 of the support portion 1420 in the vertical direction in the second guide region.

In addition, as described above, the thermoelectric module, the cover member, the guide part, the dummy module, and the shield member are correspondingly positioned not only on the upper surface but also on the lower surface of the fluid movement part 1100.

In addition, the groove portion 1420*g* of the guide part 1400 may be disposed between groove portions 1100*g* of the two fluid movement parts 1100 separated in the second direction (Y-axis direction). For example, the groove portion 1420*g* of the guide part 1400 may be disposed inside the groove portions 1100*g* of the separated fluid movement parts 1100. Therefore, the first sealing member SL1 and the second sealing member SL2 may be easily connected.

FIGS. 25 and 26 are perspective views of a dummy module included in the power generation device according to the embodiment of the present invention, and FIGS. 27 and 28 are views for describing the shield member being coupled in the power generation device according to the embodiment of the present invention.

Referring to FIGS. 25 to 28, the power generation device according to the embodiment may include a dummy module 1500 disposed on the fluid movement part 1100.

The dummy module 1500 may be disposed at one side or the other side of one surface (e.g., the upper surface or the lower surface) of the fluid movement part 1100. For example, the dummy module 1500 may be disposed outside the thermoelectric modules 1200 disposed side by side in the first direction (X-axis direction). For example, the dummy module 1500 may be disposed at both ends of the one surface of the fluid movement part 1100, and a plurality of thermoelectric modules 1200 may be disposed between the two dummy modules 1500. Therefore, at least a part of the dummy module 1500 may overlap the plurality of thermoelectric modules 1200 in the first direction (X-axis direction).

The dummy module 1500 may include an upper surface 1510 and a lower surface 1520. The upper surface 1510 of the dummy module 1500 may have a stepped structure.

In addition, a module groove 1500*g* may be positioned in the lower surface 1520 of the dummy module 1500.

Meanwhile, according to the embodiment of the present invention, the electric wires connected to the connectors may be guided using the dummy module 1500. Therefore, the dummy module according to the embodiment of the present invention may be a guide module. For example, the module groove 1500*g* of the dummy module 1500 may be bent after extending from an adjacent thermoelectric module 1200 in the first direction and extend in the second direction (Y-axis direction).

More specifically, the dummy module 1500 disposed at the one side and the other side of the upper surface 1110 of the fluid movement part 1100 may include the module groove 1500*g* extending in the first direction (X-axis direction). The module groove 1500*g* may be positioned to correspond to each of the first cover groove and the second cover groove of the cover member 1300. For example, the module groove 1500*g* may overlap the first cover groove in the first direction (X-axis direction).

Therefore, the electric wires connected to the connectors 210 and 220 may be guided in the first direction through the module groove 1500*g*. Therefore, the electric wires connected to the connectors 210 and 220 disposed in the second region A2 of the first substrate 1212 may be fixedly accommodated in the module groove 1500*g* in the first direction.

Furthermore, the module groove 1500*g* may be bent outward and extend in the second direction or in a direction opposite to the second direction. Therefore, the electric wires may be guided toward an outside of the dummy module 1500 along the module groove 1500*g*. Therefore, the electric wires may extend to the outside of the power generation device, and the electric wires may be electrically connected to an external circuit, a battery, etc.

In addition, the dummy module 1500 may include a plurality of through holes 1500*h*. The plurality of through holes 1500*h* may be positioned to correspond to the first fastening holes of the fluid movement part 1100. In other words, the through hole 1500*h* of the dummy module 1500 may be disposed to overlap the first fastening hole of the fluid movement part 1100 in the vertical direction. Therefore, the through hole 1500*h* of the dummy module 1500 and the first fastening hole of the fluid movement part 1100 may be coupled through a fastening member such as a screw.

Meanwhile, according to the embodiment of the present invention, the shield member 1600 may be disposed on at least a part of the dummy module 1500. Therefore, it is possible to prevent the electric wires guided along the dummy module 1500 from being exposed to moisture, the second fluid, or contaminants.

The dummy module 1500 may further include a protrusion 1530 protruding toward an adjacent thermoelectric module. A bottom surface of the protrusion 1530 may be formed to be coplanar with a lower surface of the dummy module, but an upper surface of the protrusion 1530 may form a step with an upper surface of the dummy module 1500. In addition, the second sealing member may be applied to the protrusion 1530 to seal between the shield member 1600 and the dummy module 1500. In the specification, the second sealing member means a sealing member extending in the second direction at a lower edge of the shield member. Furthermore, the second sealing member includes a 2-1 sealing member SL2a and a 2-2 sealing member SL2b, and the 2-1 sealing member SL2a is a sealing member guided by the above-described guide part, and the 2-2 sealing member SL2b is a sealing member at least partially overlapping the dummy module 1500 in the vertical direction. However, as described above, the second sealing member will be described in the specification.

The second sealing member SL2 may be disposed on the protrusion 1530. A part of the second sealing member SL2 may be disposed not only on the protrusion 1530 but also on the upper surface of the fluid movement part 1100. In addition, the protrusion 1530 may include a protrusion hole to be coupled with the shield member, and the shield member and the dummy module may be coupled by a fastening member such as a screw. Furthermore, the second sealing member SL2 may be applied to the protrusion and the fastening member to remove empty spaces formed upon fastening. Therefore, it is possible to suppress the second fluid or other contaminants from entering under the shield member.

In addition, the second sealing member SL2 may extend in the second direction (Y-axis direction) and overlap the groove portion 1100*g* of the fluid movement part 1100 in the vertical direction. In addition, the second sealing member SL2 may be disposed between the plurality of groove portions 1100*g* spaced apart from the upper surface of the fluid movement part 1100 in the second direction (Y-axis direction).

Therefore, the second sealing member SL2 may be in contact with the first sealing member SL1 disposed in the groove portion 1100*g* of the fluid movement part 1100. For example, the contact or connection between the second sealing member SL2 and the first sealing member SL1 may be made along an edge of the thermoelectric module group or the shield member.

Therefore, the first sealing member SL1 and the second sealing member SL2 according to the embodiment may be connected at the above-described positions to form a closed loop to surround the plurality of thermoelectric modules. Therefore, the second fluid, contaminants, etc. may not enter a gap between the shield member 1600 and the fluid movement part 1100 to reach the thermoelectric module. Therefore, it is possible to increase the reliability of the power generation device.

In addition, the shield member 1600 according to the embodiment may be disposed on the thermoelectric module 1200 and the fluid movement part 1100. As described above, the shield member 1600 may include the first part P1, the second part P2, and the stepped part P3.

The first part P1 is a region overlapping the thermoelectric module 1200 in the vertical direction, the second part P2 is a region misaligned with the thermoelectric module 1200 and disposed adjacent to the fluid movement part, and a stepped part P3 is a region disposed between the first part P1 and the second part P2. The above-described contents may be applied to a description thereof in the same manner.

Furthermore, the first part P1 may include a 1-1 part P1-1 vertically overlapping the first region of the thermoelectric module and a 1-2 part P1-2 vertically overlapping the second region of the thermoelectric module. The above-described cover member and first and second connectors may be disposed on a lower portion of the 1-2 part P1-2.

In addition, there is a step between the 1-2 part P1-2 and the 1-1 part P1-1 for the arrangement space of the cover member and the like, and the 1-2 part P1-2 may have a height from the upper surface of the fluid movement part in the vertical direction that is smaller than a height from the upper surface of the fluid movement part in the vertical direction in the 1-1 part P1-1.

In addition, the shield member 1600 may include a plurality of shield holes 1600*h* disposed in the first part P1. Each of the plurality of heat sinks 1220 may pass through each of the plurality of shield holes 1600*h*. The thermoelectric element 1210 and the cover member 1300 may be positioned on the lower portion of the first part P1.

The second part P2 may be misaligned with the thermoelectric module 1200 in the vertical direction and may be in contact with one surface of the fluid movement part 1100. In other words, the second part P2 may be disposed closer to the one surface (e.g., the upper surface) of the fluid movement part 1100 than the first part P1 is. For example, a distance between the first part P1 and the upper surface of the fluid movement part 1100 in the vertical direction may be greater than a distance between the second part P2 and the upper surface of the fluid movement part 1100 in the vertical direction. In addition, a distance between the one surface (e.g., the upper surface) of the fluid movement part 1100 and the shield member 1600 in the vertical direction may gradually increase from the second part P2 toward the first part P1. Therefore, the shield member 1600 can protect the fluid movement part 1100 and the thermoelectric element 1210 while minimizing flow resistance to the second fluid.

In addition, the shield member 1600 may further include a support region disposed on a side surface perpendicular to the upper surface of the fluid movement part 1100 extending in the second and third directions from the second part P2. Therefore, since the shield member 1600 may be disposed on one side of the fluid movement part 1100 in a "]" shape, it is possible to solve a problem that the position of the shield member 1600 is misaligned on the upper surface of the fluid movement part 1100 and increase the ease of assembly.

The stepped part P3 may be disposed between the first part P1 and the second part P2. The stepped part P3 may be in contact with the first part P1 and the second part P2.

In addition, the second part P2 may be positioned outside the thermoelectric module 1200 or the first part P1. For example, the second part P2, the stepped part P3, the first part P1, the stepped part P3, and the second part may be sequentially disposed from the shield member 1600 in the second direction (Y-axis direction).

The shield member 1600 is disposed on the thermoelectric element 1210. In this case, in order for the second fluid to pass the heat sink 1220, the shield hole 1600h may be formed in the shield member 1600, and an edge of the shield hole 1600h may be formed on the second substrate of the thermoelectric element 1210 so that the heat sink 1220 may be exposed through the shield hole 1600h. In other words, the edge of the shield hole 1600h may be disposed on the second substrate of the thermoelectric element 1210, and the heat sink 1220 may pass through the shield hole 1600h. Therefore, since the second fluid may directly pass the heat sink 1220 even while protecting the inside of the thermoelectric element 1210 from external contaminants, moisture, and the second fluid, heat exchange between the second fluid and the heat sink 1220 may be efficiently performed. In this case, the edge of the shield hole 1600h may be disposed on the second substrate of the thermoelectric element 1210, and a size (or an area on XY plane) of the shield hole 1600h may be smaller than a size of the second substrate of the thermoelectric element 1210 and greater than a size of the heat sink 1220, that is, a size of the surface in which the heat sink 1220 is disposed on the second substrate so that the heat sink 1220 may pass through the shield hole 1600h.

Meanwhile, as shown, a plurality of thermoelectric elements 1210 may be disposed on the upper surface 1110 of the fluid movement part 1100, and the heat sink 1220 may be disposed on each thermoelectric element 1210. To this end, a plurality of shield holes 1600h may be formed in the shield member 1600, and the edge of each shield hole 1600h may be disposed on the second substrate of each thermoelectric element 1210 so that each heat sink 1220 may pass through each shield hole 1600h. Therefore, since the plurality of thermoelectric elements 1210 may be covered using one shield member 1600, it is possible to simplify an assembly process and a structure of the shield member 1600.

According to the embodiment of the present invention, a plurality of through holes may be further formed in the shield member 1600. In this case, the fluid movement part and the shield member 1600 may be fastened through the plurality of through holes.

Throughout the specification, the thermoelectric elements 100 and 1210 have been described as including the first substrate 110, the first electrode 120, the P-type thermoelectric leg 130, the N-type thermoelectric leg 140, the second electrode 150, and the second substrate 160, but definitions of the thermoelectric elements 100 and 1210 are not limited thereto, and the thermoelectric elements 100 and 1210 may also mean as including the first electrode 120, the P-type thermoelectric leg 130, the N-type thermoelectric leg 140, the second electrode 150, and the second substrate 160 and being disposed on the first substrate 110.

In addition, throughout the specification, it has been described that the thermoelectric device 1000 includes the fluid movement part 1100, the thermoelectric module 1200, the cover member 1300, and the shield member 1600 and the thermoelectric module 1200 includes the thermoelectric element 1210 and the heat sink 1220, but is not limited thereto, and the thermoelectric module may also mean as including all of the fluid movement part 1100, the thermoelectric element 1210, the heat sink 1220, the cover member 1300, and the shield member 1600.

FIG. 29 is a view for describing positions of a first sealing member, a second sealing member, and a third sealing member in the power generation device according to the embodiment of the present invention, FIG. 30 is an enlarged view of portion K3 in FIG. 29, and FIG. 31 is a cross-sectional view showing the first sealing member, the second sealing member, and the third sealing member along line H-H' in FIG. 29.

Referring to FIGS. 29 to 31, the thermoelectric device according to the embodiment may further include a third sealing member SL3 disposed between the thermoelectric element 1210 and the shield member 1600.

First, as described above, the shield member 1600 may be disposed on the thermoelectric element 1210 to cover at least a part of the thermoelectric element 1210. However, in order for the second fluid to pass the heat sink 1220, the shield hole 1600h may be disposed in the shield member 1600. In addition, the edge of the shield hole 1600h may be disposed on the second substrate 1214 of the thermoelectric element 1210, and the heat sink 1220 may be exposed through the shield hole 1600h. In other words, the edge of the shield hole 1600h may be disposed on the second substrate of the thermoelectric element 1210, and the heat sink 1220 may pass through the shield hole 1600h. Therefore, heat exchange can be efficiently performed while the second fluid passes the heat sink 1220.

Furthermore, the third sealing member SL3 may be disposed between the shield member 1600 and the second substrate 1214 along the edge of the shield hole 1600h. With this configuration, the third sealing member SL3 can protect the inside of the thermoelectric element 1210 from external contaminants, moisture, and the second fluid.

In this case, the edge of the shield hole 1600h may be disposed on the second substrate of the thermoelectric element 1210, and the size of the shield hole 1600h may be smaller than the size of the second substrate of the thermoelectric element 1210 and greater than the size of the heat sink 1220, that is, the surface in which the heat sink 1220 is disposed on the second substrate so that the heat sink 1220 may pass through the shield hole 1600h. For example, the edge of the shield hole 1600h and the heat sink 1220 may be spaced apart from each other in the first direction (X-axis direction) or the second direction (Y-axis direction).

In addition, the third sealing member SL3 may be disposed between the edge of the shield hole 1600h and the edge of the second substrate 1214. Therefore, the third sealing member SL3 may also overlap the first substrate 1212 in the vertical direction. In addition, the third sealing member SL3 may overlap the first part P1 of the shield member 1600, particularly, the 1-1 part P1-1, in the vertical direction.

In addition, the third sealing member SL3 according to the embodiment may be disposed to be spaced apart from the first sealing member SL1 in the second direction (Y-axis direction). Furthermore, the first sealing member SL1 and the third sealing member SL3 may have a height difference from each other corresponding to the length of the thermoelectric element 1210 in the vertical direction.

As a modified example, the third sealing member SL3 may also extend along the first part P1 and the stepped part P3 and may be connected to the first sealing member SL1 on the lower portion of the second part P2. For example, the third sealing member SL3 may be connected to the first sealing member SL1 on the 1-1 groove. Therefore, it is possible to increase the coupling force between the shield member, the thermoelectric module, and the fluid movement part by coupling the first sealing member and the third sealing member.

The power generation system may generate power through a heat source generated from vessels, automobiles, power plants, geothermal plant, etc., and a plurality of power generation devices may be arranged inside thereof to efficiently converge heat sources. In this case, each power generation device can increase the cooling performance of the low temperature part of the thermoelectric element by increasing the bonding force between the thermoelectric module and the fluid movement part, thereby increasing the efficiency and reliability of the power generation device, and thus it is possible to increase the fuel efficiency of transportation devices such as vessels or vehicles. Therefore, in the shipping and transportation industries, transportation costs can be reduced and an eco-friendly industrial environment can be created, and when applied to manufacturing industries, such as steel mills, processing costs or the like can be reduced.

Although the above description has been made with reference to exemplary embodiments of the present invention, those skilled in the art will be able to understand that the present invention may be variously modified and changed without departing from the spirit and scope of the present invention described in the appended claims.

The invention claimed is:

1. A thermoelectric device comprising:
a fluid movement part including a fluid hole extending in a first direction in one surface of the fluid movement part;
a thermoelectric module disposed on the one surface;
a first sealing member;
a second sealing member at least partially connected to the first sealing member; and
a shield member disposed on the thermoelectric module,
wherein the shield member includes a first part overlapping the thermoelectric module in a vertical direction, a second part misaligned with the thermoelectric module in the vertical direction, and a stepped part configured to connect the first part and the second part,
wherein the second part is closer to the one surface of the fluid movement part than the first part is,
wherein the fluid hole of the fluid movement part overlaps the second part and the stepped part in the vertical direction,
wherein the fluid movement part further includes a groove portion extending in the first direction in the one surface of the fluid movement part, and
wherein the first sealing member is disposed in the groove portion of the fluid movement part.

2. The thermoelectric device of claim 1, wherein the fluid hole of the fluid movement part is disposed under a boundary at which the second part is in contact with the stepped part.

3. The thermoelectric device of claim 1, wherein the thermoelectric module is positioned inside the first sealing member and the second sealing member under the shield member.

4. The thermoelectric device of claim 1, wherein the second sealing member is provided as a plurality of second sealing members disposed to be spaced apart from each other in the first direction, and
wherein the first sealing member is provided as a plurality of first sealing members disposed to be spaced apart from each other in a second direction perpendicular to the first direction.

5. The thermoelectric device of claim 4, wherein the thermoelectric module is disposed between the plurality of second sealing members and between the plurality of first sealing members.

6. The thermoelectric device of claim 1, wherein the first part has a height from the one surface of the fluid movement part that is greater than a height between the second part and the one surface of the fluid movement part.

7. The thermoelectric device of claim 6, wherein the first part includes a plurality of shield holes,
wherein the thermoelectric module includes a thermoelectric element in contact with the one surface of the fluid movement part and a heat sink disposed on the thermoelectric element, and
wherein the heat sink passes through the plurality of shield holes.

8. The thermoelectric device of claim 7, wherein the first part includes a 1-1 part overlapping the thermoelectric module in the vertical direction and a 1-2 part misaligned with the thermoelectric element in the vertical direction, and
wherein a height between the 1-2 part and the one surface of the fluid movement part is greater than a height between the 1-1 part and the one surface of the fluid movement part.

9. The thermoelectric device of claim 8, wherein the thermoelectric module further includes a connector disposed at one side of the thermoelectric element and connected to the thermoelectric element, and
wherein the connector overlaps the 1-1 part in the vertical direction.

10. The thermoelectric device of claim 9, wherein the fluid hole of the fluid movement part includes a 1-1 fluid hole and a 1-2 fluid hole disposed to be spaced apart from each other in a second direction perpendicular to the first direction.

11. The thermoelectric device of claim 10, further comprising a third sealing member disposed between the thermoelectric element and the first part.

12. The thermoelectric device of claim 11, wherein the thermoelectric element includes a first substrate in contact with the one surface of the fluid movement part, a second substrate disposed to be spaced apart from the first substrate, a first electrode disposed on the first substrate, a second electrode disposed under the second substrate, and a plurality of thermoelectric legs disposed between the first electrode and the second electrode, and
wherein the third sealing member overlaps the first substrate in the vertical direction.

13. The thermoelectric device of claim 11, wherein the third sealing member is disposed to be spaced apart from the first sealing member or the second sealing member.

14. The thermoelectric device of claim 11, wherein the third sealing member extends toward the first sealing member or the second sealing member along the stepped part, and
wherein a distance between the one surface of the fluid movement part and the shield member gradually increases from the second part toward the first part.

* * * * *